(12) United States Patent
Howard et al.

(10) Patent No.: US 7,986,526 B1
(45) Date of Patent: Jul. 26, 2011

(54) ACOUSTICALLY ABSORPTIVE APPARATUS FOR AN ELECTRONICS RACK OF A DATA CENTER

(75) Inventors: Glendowlyn F. Howard, Durham, NH (US); Matthew A. Nobile, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/712,270

(22) Filed: Feb. 25, 2010

(51) Int. Cl.
*H05K 7/20* (2006.01)
(52) U.S. Cl. ............... 361/694; 361/679.46; 361/679.49; 361/679.51; 361/690; 361/691; 181/200; 181/201; 181/202; 181/224; 454/184
(58) Field of Classification Search ............ 361/679.46–679.53, 690–696, 361/698, 699, 700, 717–728; 181/200–202, 181/198, 224, 225, 229, 252, 255, 258, 268, 181/286, 288, 290; 454/184, 278; 312/213, 312/223.2, 223.3, 236; 165/80.3, 121–126, 165/185; 62/137, 259.2
See application file for complete search history.

(56) References Cited

U.S. PATENT DOCUMENTS

| | | | |
|---|---|---|---|
| 3,628,626 A * | 12/1971 | Merrill | 181/290 |
| 5,526,228 A | 6/1996 | Dickson et al. | |
| 6,104,608 A | 8/2000 | Casinelli et al. | |
| 6,481,527 B1 | 11/2002 | French et al. | |
| 6,745,149 B2 | 6/2004 | Beeten | |
| 6,859,366 B2 * | 2/2005 | Fink | 361/690 |
| 6,927,977 B2 | 8/2005 | Singer | |
| 7,046,514 B2 * | 5/2006 | Fink et al. | 361/695 |
| 7,259,963 B2 | 8/2007 | Germagian et al. | |
| 7,266,964 B2 * | 9/2007 | Vogel et al. | 62/259.2 |
| 7,283,359 B2 | 10/2007 | Bartell et al. | |

(Continued)

FOREIGN PATENT DOCUMENTS

GB 2 155 972 A1 10/1985

(Continued)

OTHER PUBLICATIONS

"Inter-Rack Flow Seperator to Prevent Computer Rack Hot Exhaust Air Entry Into Cold Region at Rack Inlet of Computer Data Center Facilities", IBM, ip.com, Prior Art Database, ip.com No. IPCOM000137460D, pp. 1-4 (Jun. 20, 2006).

(Continued)

*Primary Examiner* — Michael V Datskovskiy
(74) *Attorney, Agent, or Firm* — Dennis Jung, Esq.; Kevin P. Radigan, Esq.; Heslin Rothenberg Farley & Mesiti P.C.

(57) ABSTRACT

An acoustically absorptive apparatus is provided which includes an acoustically absorptive panel and an attachment mechanism. The acoustically absorptive panel is configured to reside along a side of an electronics rack, and includes a multilayer structure to attenuate noise. The attachment mechanism slidably mounts the acoustically absorptive panel to the electronics rack and facilitates sliding of the panel relative to the rack between retracted and extended positions. In the refracted position, the panel is disposed along the side of the rack, and in the extended position, the panel extends beyond a front or back edge of the electronics rack to facilitate attenuating noise emanating from the rack or an aisle alongside a row of multiple racks. In addition, the acoustically absorptive panel hingedly couples along a vertical edge to the attachment mechanism such that the panel is also rotatable outward away from the side of the electronics rack.

20 Claims, 20 Drawing Sheets

U.S. PATENT DOCUMENTS

| | | |
|---|---|---|
| 7,334,662 B1 | 2/2008 | Anderl et al. |
| 7,379,298 B2 | 5/2008 | Walsh et al. |
| 7,379,299 B2 | 5/2008 | Walsh et al. |
| 7,382,632 B2 | 6/2008 | Alo et al. |
| 7,385,810 B2 | 6/2008 | Chu et al. |
| 7,400,501 B2 | 7/2008 | Bartell et al. |
| 7,430,118 B1 * | 9/2008 | Noteboom et al. ........... 361/695 |
| 7,542,287 B2 | 6/2009 | Lewis, II |
| 7,549,917 B2 | 6/2009 | Henry et al. |
| 7,646,603 B2 * | 1/2010 | Bard et al. .................... 361/696 |
| 7,656,660 B2 * | 2/2010 | Hoeft et al. .............. 361/679.51 |
| 7,667,965 B2 * | 2/2010 | Nobile .......................... 361/695 |
| 7,672,128 B2 * | 3/2010 | Noteboom et al. ........... 361/696 |
| 7,800,900 B1 * | 9/2010 | Noteboom et al. ...... 361/679.47 |
| 2006/0139877 A1 * | 6/2006 | Germagian et al. .......... 361/695 |
| 2006/0185931 A1 | 8/2006 | Kawar |
| 2006/0260338 A1 * | 11/2006 | VanGilder et al. ........... 62/259.2 |
| 2007/0135032 A1 | 6/2007 | Wang |
| 2007/0230124 A1 | 10/2007 | Bartell et al. |
| 2008/0051726 A1 | 2/2008 | Campbell et al. |
| 2008/0144280 A1 | 6/2008 | Walsh et al. |
| 2008/0230305 A1 | 9/2008 | Goto et al. |
| 2008/0257639 A1 | 10/2008 | Yamaguchi et al. |
| 2008/0291626 A1 * | 11/2008 | Nelson et al. ................. 361/696 |
| 2009/0080173 A1 | 3/2009 | Porter et al. |
| 2009/0129000 A1 | 5/2009 | Hoeft et al. |
| 2009/0129015 A1 | 5/2009 | Nobile |
| 2009/0129016 A1 | 5/2009 | Hoeft et al. |
| 2009/0168345 A1 * | 7/2009 | Martini ........................ 361/691 |
| 2009/0201640 A1 | 8/2009 | Bard et al. |
| 2010/0108272 A1 * | 5/2010 | Karidis ........................ 160/238 |

FOREIGN PATENT DOCUMENTS

| | | |
|---|---|---|
| JP | 60189522 A | 9/1985 |
| WO | WO 91/08358 A | 6/1991 |

OTHER PUBLICATIONS

"Notification of Transmittal of the International Search Report and the Written Opinion of the International Searching Authority, or the Declaration", mailed Mar. 19, 2009, International Application No. PCT/EP2008/065737 (13 pgs.).

* cited by examiner

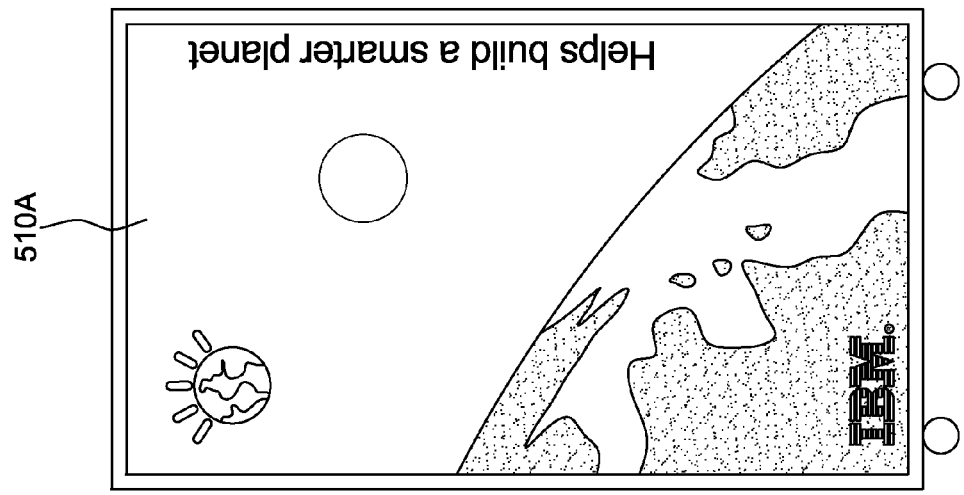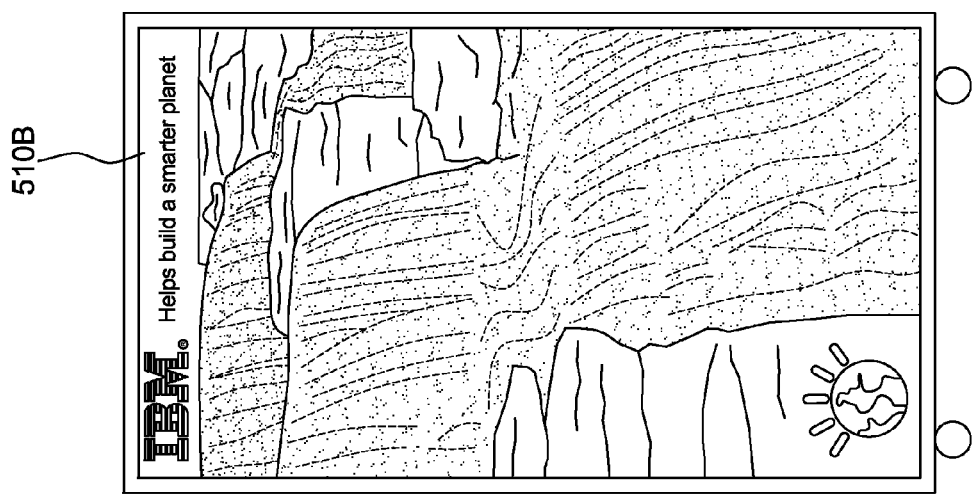
FIG. 5

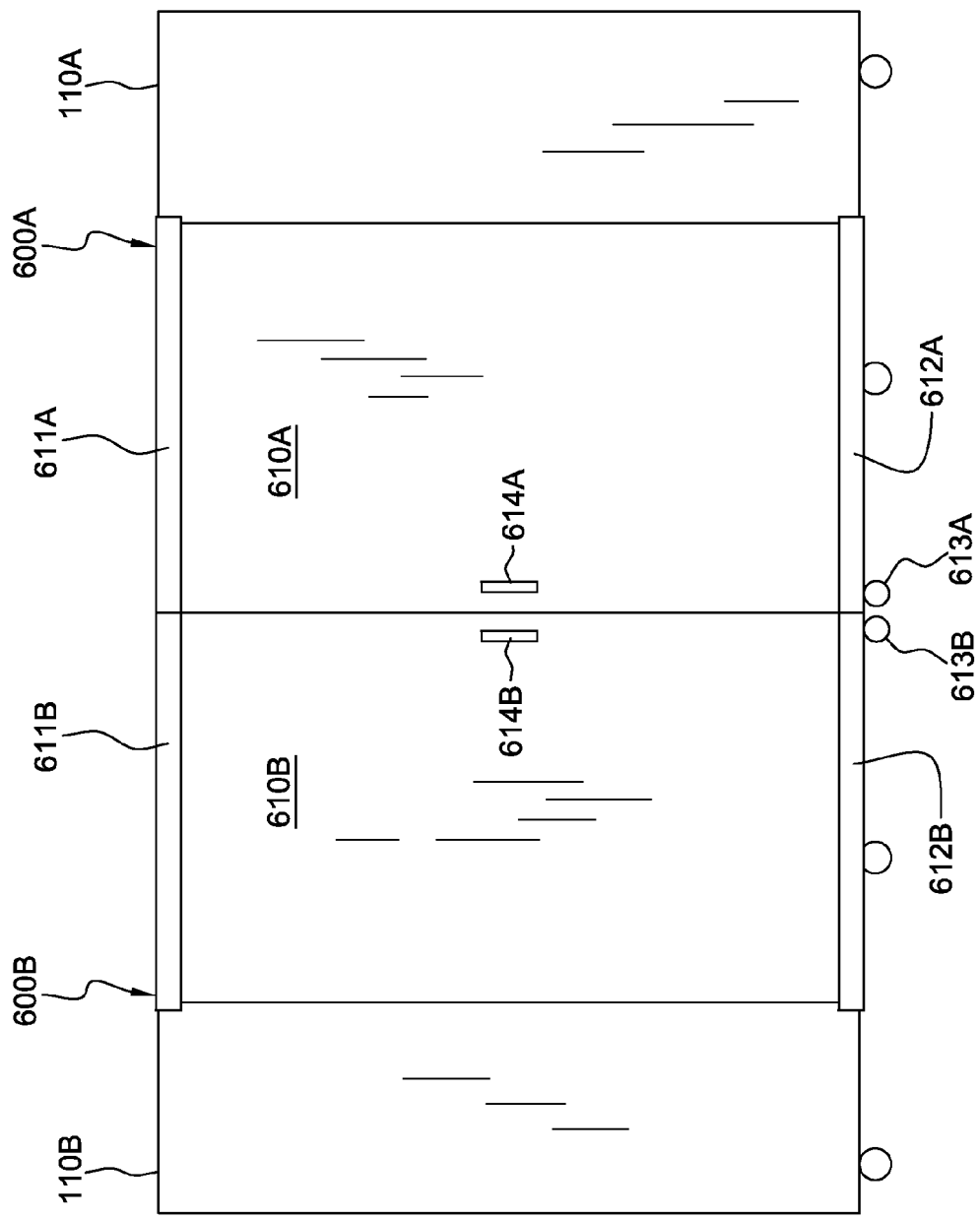

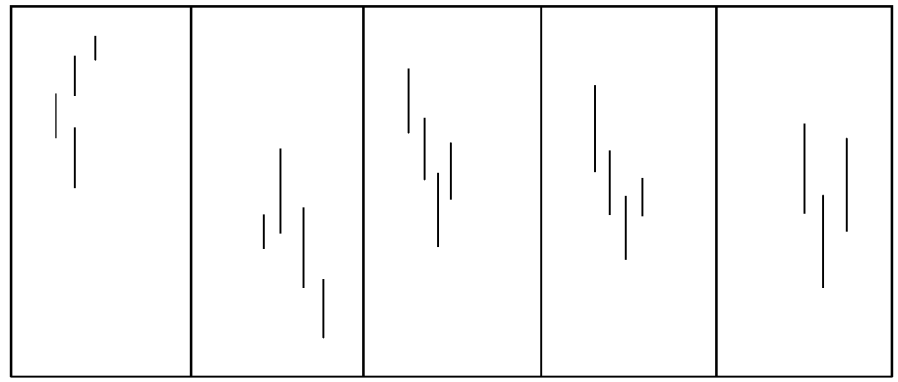
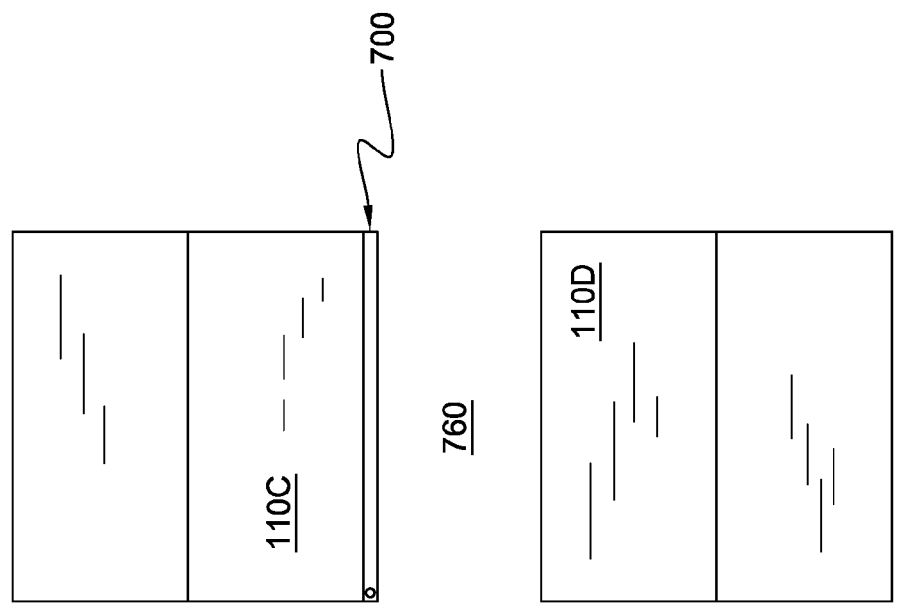
FIG. 7E

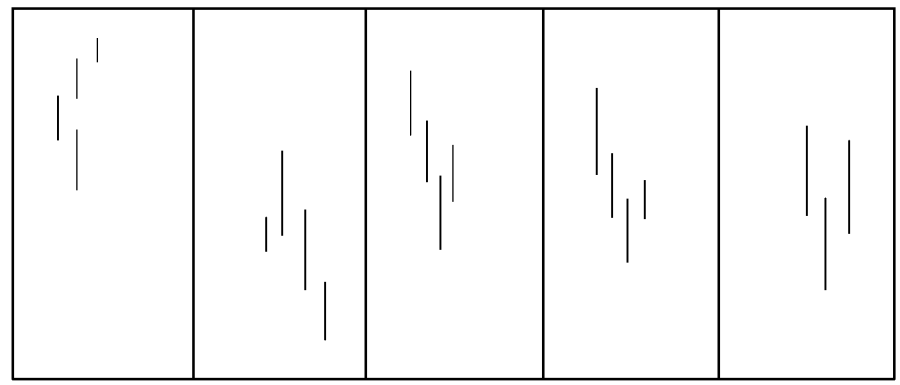
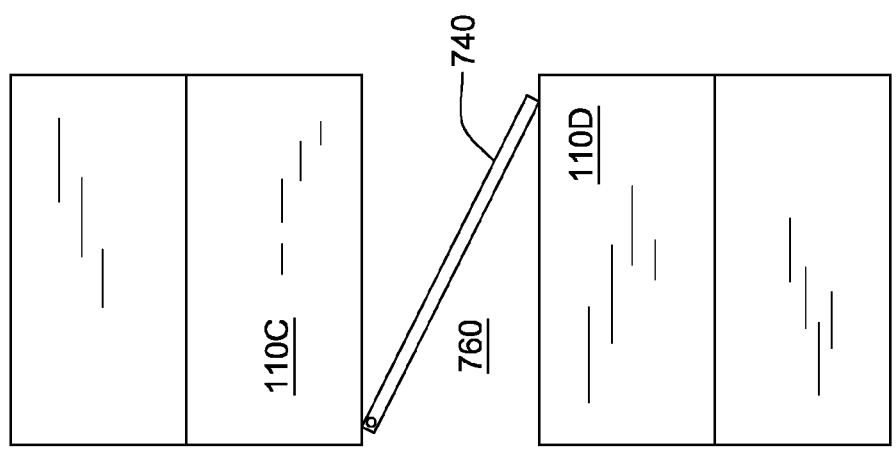
FIG. 7F

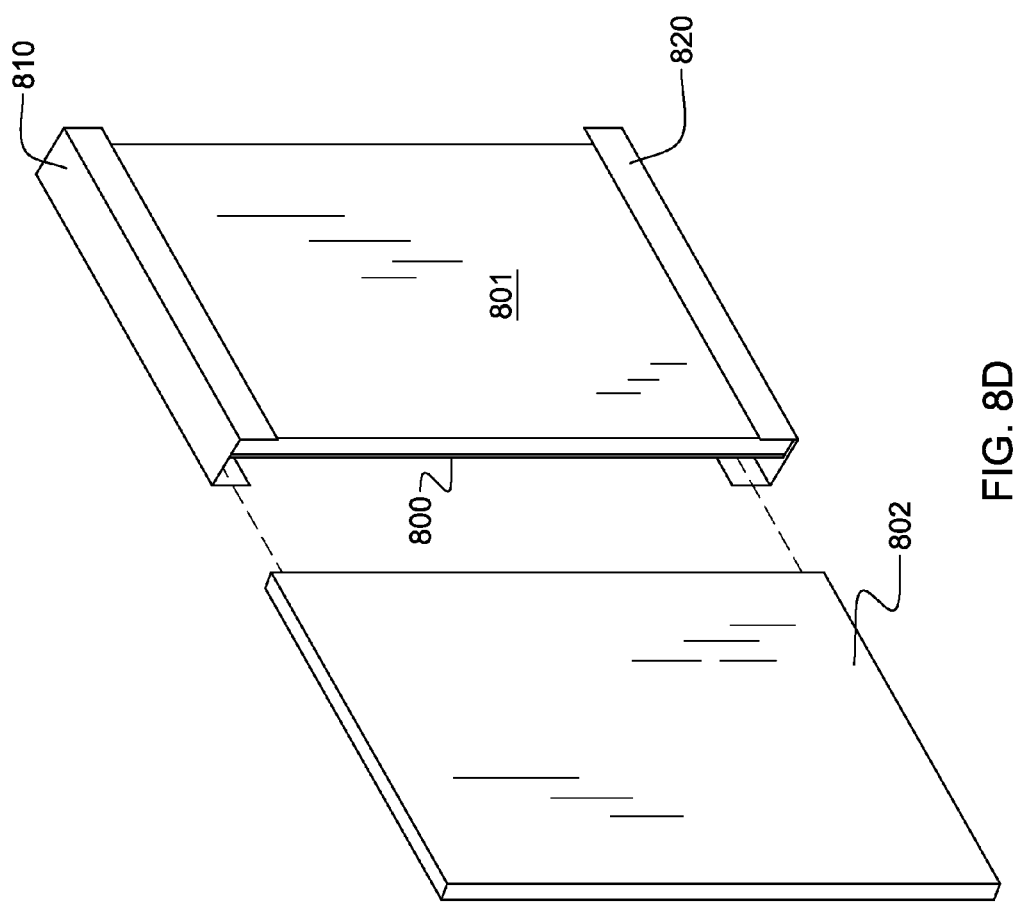

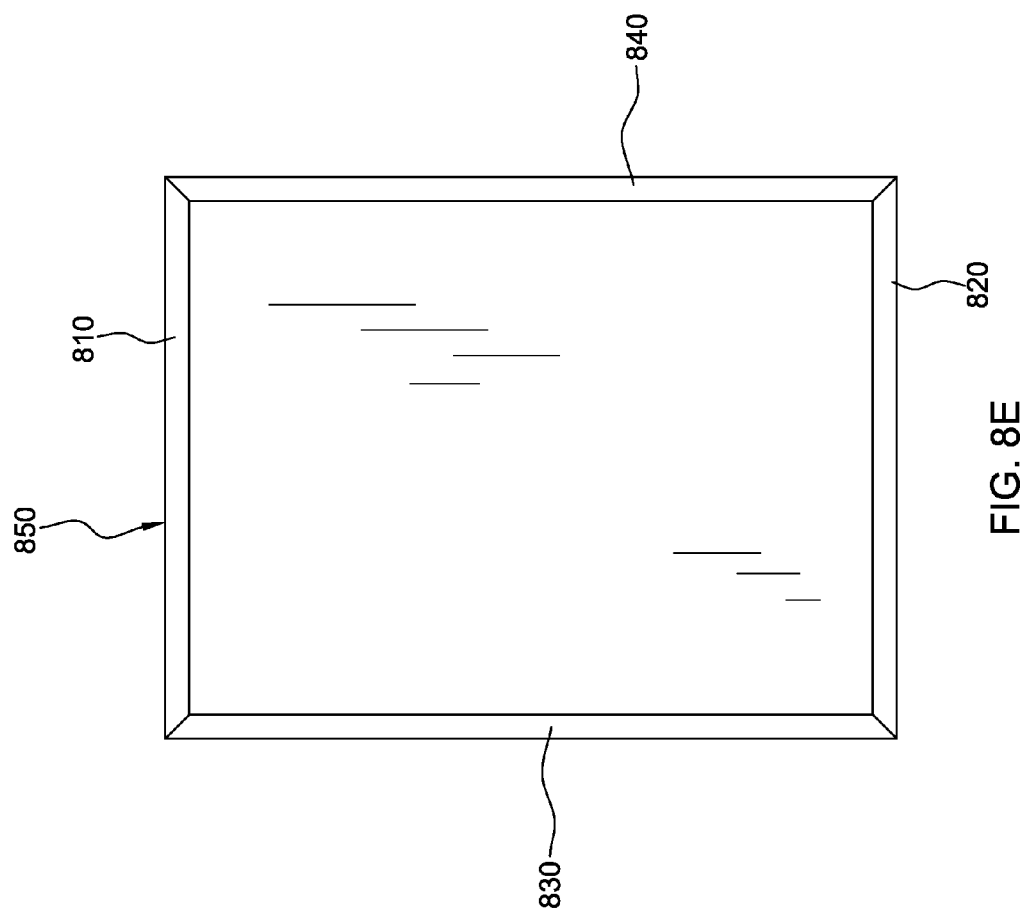

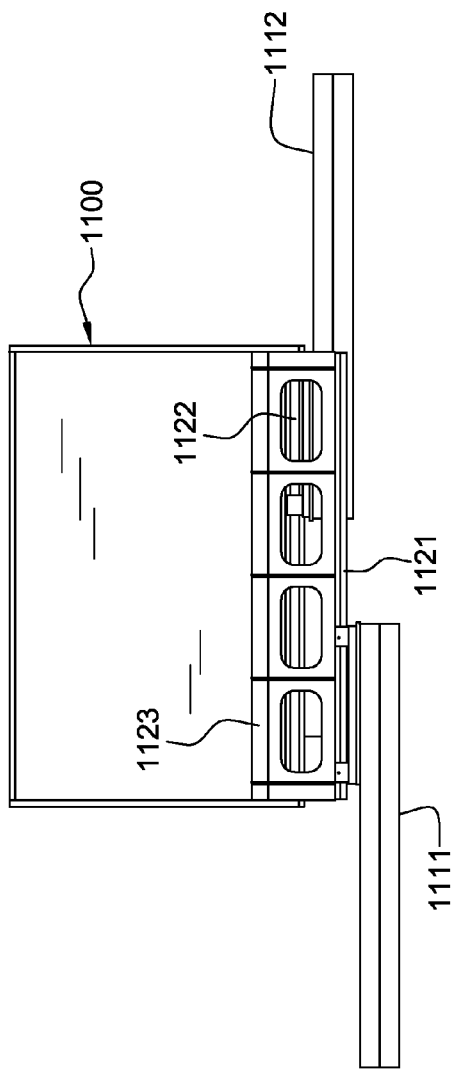
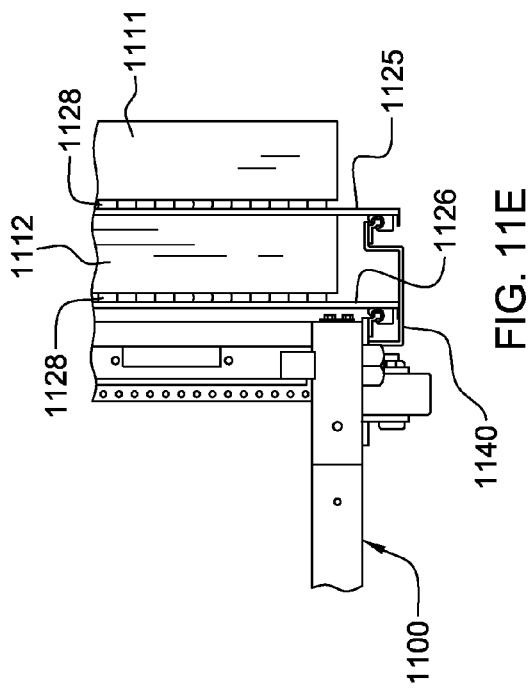
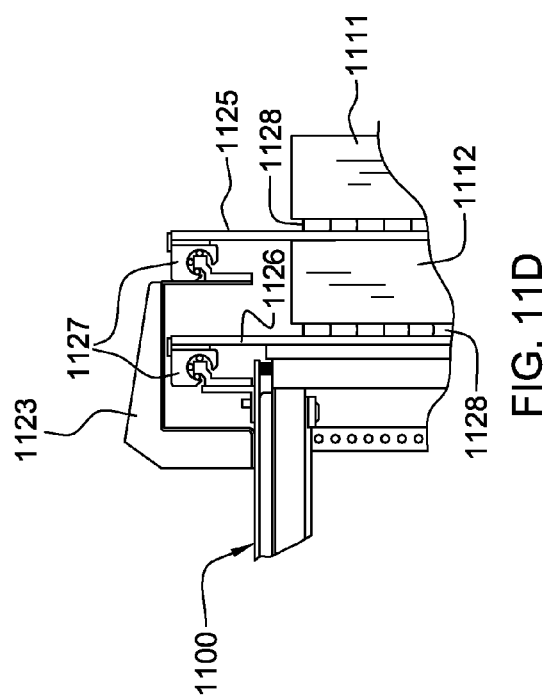

ACOUSTICALLY ABSORPTIVE APPARATUS FOR AN ELECTRONICS RACK OF A DATA CENTER

BACKGROUND

The present invention relates in general to apparatuses and methods for suppressing noise emanating from rack-mounted assemblages of individual electronics units within a data center.

The power dissipation of integrated circuit chips, and the modules containing the chips, continues to increase in order to achieve increases in processor performance. This trend poses challenges at both the module and system level. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device or by increasing the rotational speed (i.e., RPMs) of an existing air moving device. However, this approach is becoming problematic at the rack level in the context of a computer installation (i.e., a data center).

For example, the sensible heat load carried by the air exiting the rack is stressing the ability of the room air-conditioning to effectively handle the load. This is especially true for large installations with "server farms" or large banks of electronics racks close together. In such installations not only will the room air-conditioning be challenged, but the situation may also result in recirculation problems with some fraction of the "hot" air exiting one rack unit being drawn into the air inlet of the same rack or a nearby rack. This recirculating flow is often extremely complex in nature, and can lead to significantly higher rack inlet temperatures than expected. This increase in cooling air temperature may result in components exceeding their allowable operating temperature and in a reduction in long term reliability of the components.

In addition, with the large number of electronics racks in many data center installations, the acoustic noise generated by the fans in the electronics racks circulating air through the racks is rising to unacceptably high levels.

BRIEF SUMMARY

In one aspect, the shortcomings of the prior art are overcome and additional advantages are provided through the provision of an acoustically absorptive apparatus which includes an acoustically absorptive panel and an attachment mechanism to slidably mount the acoustically absorptive panel to an electronics rack. The acoustically absorptive panel is configured to be disposed along a side of the electronics rack, and the panel includes a multilayer structure configured to attenuate noise. The attachment mechanism facilitates sliding of the acoustically absorptive panel relative to the electronics rack between a retracted position and an extended position. In the retracted position, the acoustically absorptive panel is disposed along the side of the electronics rack, while in the extended position, the acoustically absorptive panel extends beyond a front edge or a back edge of the electronics rack to facilitate attenuating noise emanating from the electronics rack.

In another aspect, a data center is provided which includes multiple electronics racks and at least one acoustically absorptive apparatus. Each electronics rack includes: an air inlet side and an air outlet side, the air inlet side and air outlet side respectively enabling ingress and egress of external air; at least one electronics subsystem requiring cooling; and at least one air moving device, the at least one air moving device being capable of causing external air to flow from the air inlet side of the electronics rack, across the at least one electronics subsystem, to the air outlet side of the electronics rack. Each acoustically absorptive apparatus is coupled to a respective electronics rack of the multiple electronics racks, and includes: an acoustically absorptive panel configured for disposition along a side of the electronics rack interconnecting the air inlet side and the air outlet side thereof, the acoustically absorptive panel comprising a multilayer structure configured to attenuate noise; and an attachment mechanism slidably mounting the acoustically absorptive panel to the electronics rack, the attachment mechanism facilitating sliding of the acoustically absorptive panel relative to the electronics rack between a retracted position and an extended position, wherein in the refracted position the acoustically absorptive panel is disposed along the side of the electronics rack and in the extended position the acoustically absorptive panel extends beyond one of the air inlet side or the air outlet side of the electronics rack to facilitate attenuating noise emanating therefrom.

In a further aspect, a method of facilitating attenuation of noise emanating from an electronics rack is provided. The method includes: providing an acoustically absorptive panel configured to be disposed along a side of the electronics rack, the acoustically absorptive panel including a multilayer structure configured to attenuate noise; and slidably mounting the acoustically absorptive panel to the electronics rack, wherein the acoustically absorptive panel is slidable relative to the electronics rack between a retracted position and an extended position, wherein in the refracted position the acoustically absorptive panel is disposed along the side of the electronics rack and in the extended position the acoustically absorptive panel extends beyond a front edge or a back edge of the electronics rack to facilitate attenuating noise emanating therefrom.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 5 is a side elevational view of two opposing electronics racks, each having an acoustically absorptive panel with printed and graphical material disposed thereon, in accordance with an aspect of the present invention;

FIG. 6 is a side elevational view of two opposing, spaced electronics racks and another embodiment of two acoustically absorptive apparatuses coupled thereto, with the acoustically absorptive panels of the acoustically absorptive apparatuses shown extended to close off the aisle defined between the two electronics racks, and thereby facilitate attenuation of noise radiating down the aisle from the electronics racks, in accordance with an aspect of the present invention;

FIG. 7E is a top plan view of two opposing rows of electronics racks of a data center, wherein a space (or gap) is shown between two electronics racks in one row of the data center, and an acoustically absorptive apparatus such as depicted in FIGS. 7A-7D is mounted to one of the electronics racks adjacent to the space in the row, in accordance with an aspect of the present invention;

FIG. 7F depicts the plan view of FIG. 7E, with the acoustically absorptive panel of the acoustically absorptive apparatus shown rotated outward away from the side of the electronics rack to which the acoustically absorptive apparatus is mounted, and physically contacting a side of the adjacent electronics rack, in accordance with an aspect of the present invention;

FIG. 8D illustrates the acoustically absorptive panel of FIG. 8C, with the first acoustically absorptive material layer shown in position overlying the center septum, in accordance with an aspect of the present invention;

FIG. 8E is a side elevational view of the acoustically absorptive panel of FIGS. 8B-8D, shown with one embodiment of the full frame in place, in accordance with an aspect of the present invention;

FIG. 11C is a plan view of the electronics rack frame and acoustically absorptive apparatus of FIGS. 11A & 11B, with the acoustically absorptive panels shown partially extended beyond the front edge and back edge of the electronics rack frame, in accordance with an aspect of the present invention;

FIG. 11D is a partial enlargement of the electronics rack frame and acoustically absorptive apparatus of FIGS. 11A-11C, showing an upper portion of the acoustically absorptive panels and the dual track attachment mechanism, in accordance with an aspect of the present invention; and FIG. 11E is a further partial enlargement of the electronics rack frame and acoustically absorptive apparatus of FIGS. 11A-11D, showing a lower portion of the acoustically absorptive panels and the dual track attachment mechanism, in accordance with an aspect of the present invention.

DETAILED DESCRIPTION

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronics subsystems or drawers, each having one or more heat generating components disposed therein requiring cooling. "Electronics subsystem" refers to any sub-housing, blade, book, drawer, node, compartment, etc., having one or more heat generating electronic components disposed therein. Each electronics subsystem of an electronics rack may be movable or fixed relative to the electronics rack, with the electronics drawers of a multi-drawer rack unit and blades of a blade center system being two examples of electronics subsystems of an electronics rack to be cooled. Further, "data center" refers to a computer installation containing one or more electronics racks to be cooled. As a specific example, a data center may include one or more rows of rack-mounted units, such as server units.

Reference is made below to the drawings, which are not drawn to scale for reasons of understanding, wherein the same reference numbers used throughout different figures designate the same or similar components.

Figure 1:
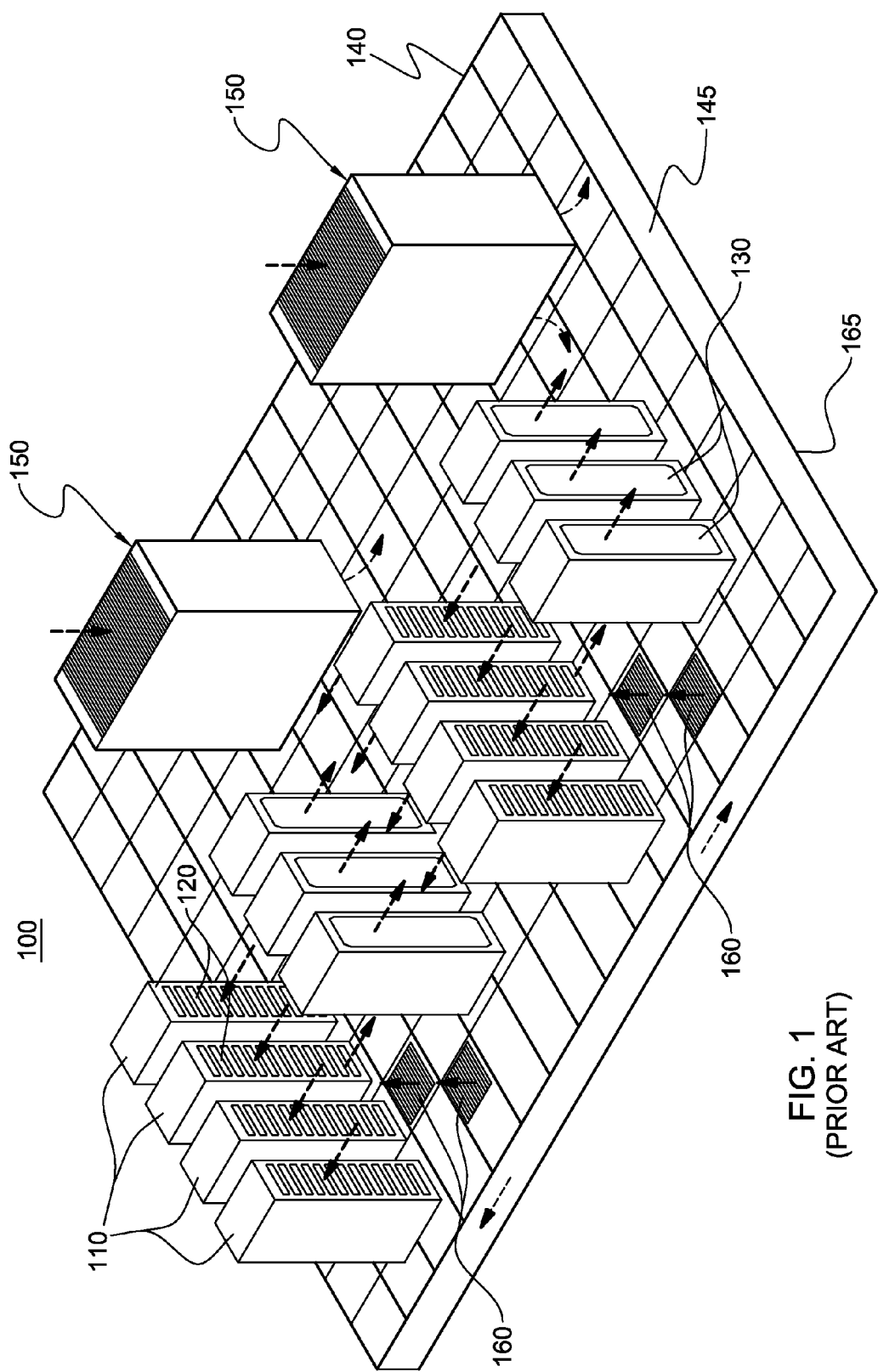
FIG. 1 depicts one embodiment of a conventional raised floor layout of an air-cooled data center.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cold air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic components within the drawer(s) of the rack. The supply air plenum 145 provides conditioned and cooled air to the air-inlet sides of the electronics racks via perforated floor tiles 160 disposed in the "cold" aisles of the computer installation. The cold air is supplied to plenum 145 by one or more air conditioning units 150, also disposed within the data center. As shown, electronics racks 110 may be spaced apart, for example, to ensure a greater supply of cooled air from perforated floor tiles 160 for each electronics rack.

Figure 2:
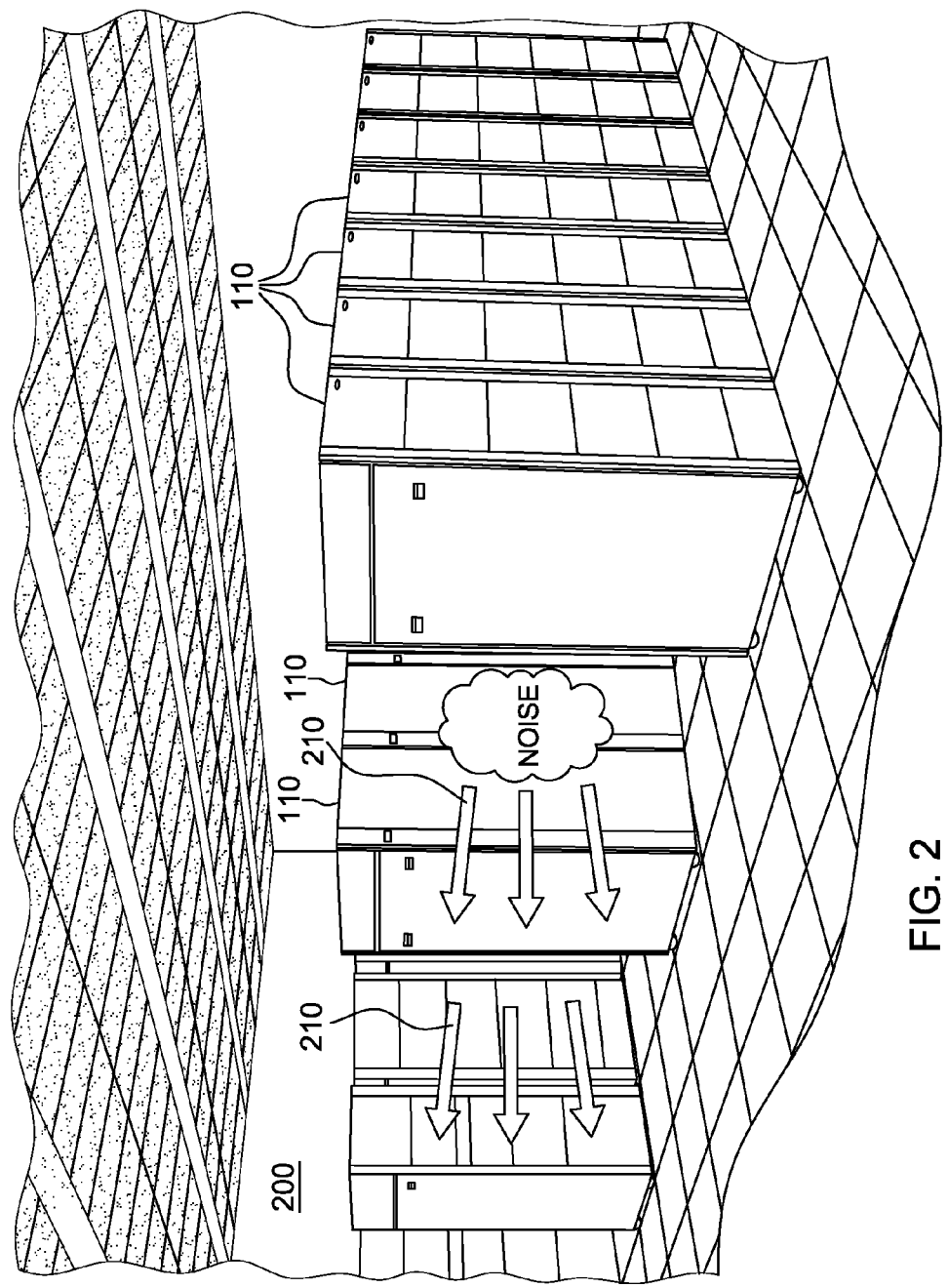
FIG. 2 depicts a further embodiment of a conventional raised floor air-cooled data center, illustrating (by way of example) noise emanating from a cold air or hot air aisle of the data center.

FIG. 2 depicts another embodiment of a raised floor, air-cooled data center, generally denoted 200, wherein multiple air-cooled electronics racks 110 are disposed in multiple rows defining alternating cold air and hot air aisles of the data center. In FIG. 2, noise 210 is shown radiating from the ends of the aisles into other areas of data center 200, for example, where personnel may typically be located or walk. As described above, this noise 210 is generated, in part, from the air moving devices disposed within the racks. As electronics subsystems within the rack units become more powerful, and their air cooling requirements continue to increase, noise emanating from the racks also increases. This noise ultimately radiates out the ends of the aisles and spreads out into the data center unattenuated, where it then reflects off the walls and other objects of the data center, generally adding greatly to the overall ambient noise levels within the data center. Additionally, hot exhaust air from the air exhaust aisle(s) is able to recirculate around the end rack units in the rows and mix with the cool air of the cool air aisle(s), thus detrimentally raising the temperature of air being forced across the electronics components in the racks. This problem is exacerbated for electronics racks close to the ends of the aisle(s). A further issue occurs when a space or other gap exists between individual electronics racks in a row. See, for example, the spacing of the rack units in the rows of the data center depicted in FIG. 7E. Such a gap(s) will permit hot air from the hot air aisle to recirculate around the side of the rack to the cold air aisle, again detrimentally raising the air inlet temperature to the adjacent electronics rack(s).

Figure 3:
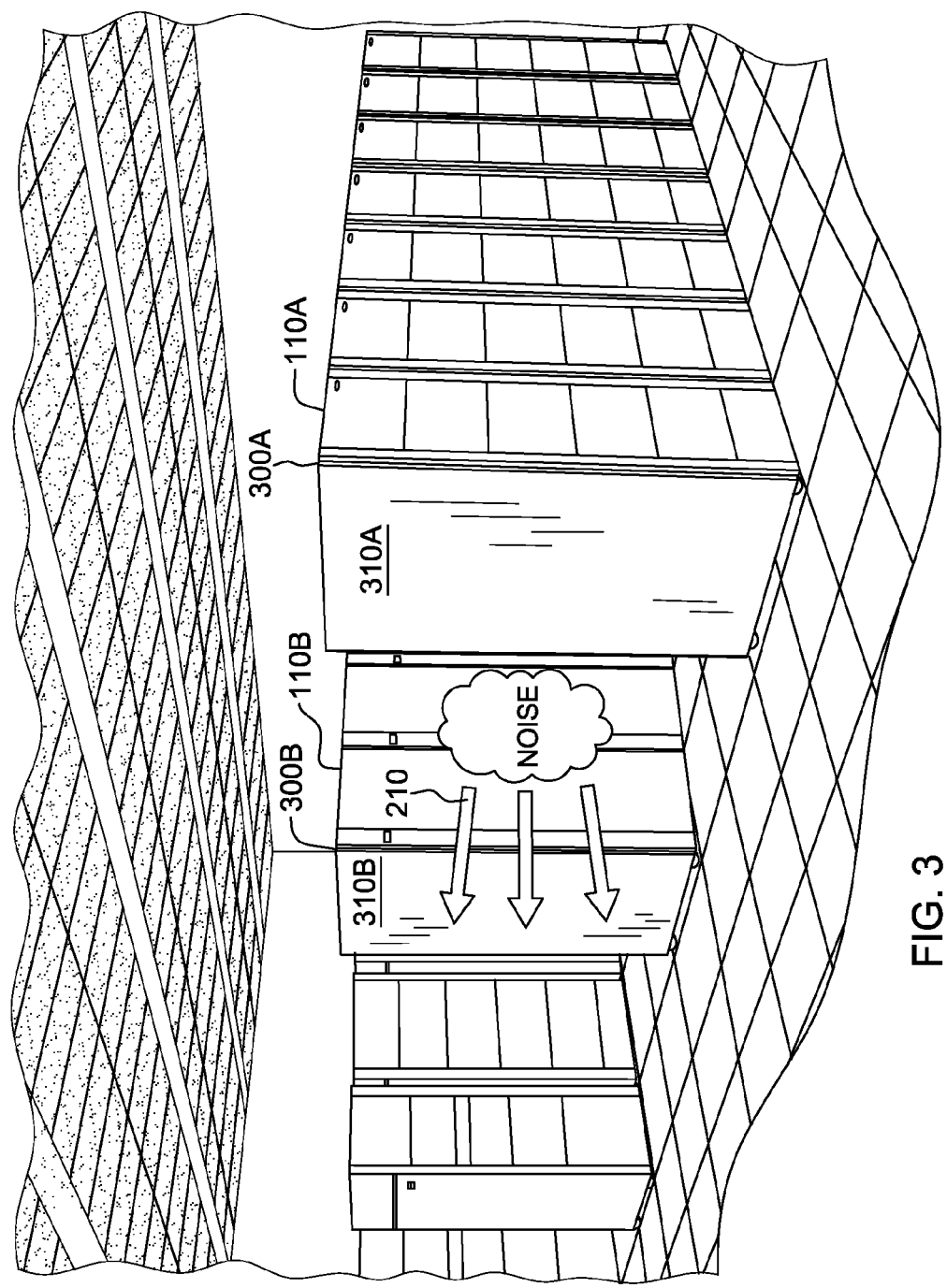
FIG. 3 depicts the data center of FIG. 2, with acoustically absorptive apparatuses mounted to the ends of two opposing rows of electronics racks defining a cold air or hot air aisle of the data center, in accordance with an aspect of the present invention.
Figure 4:
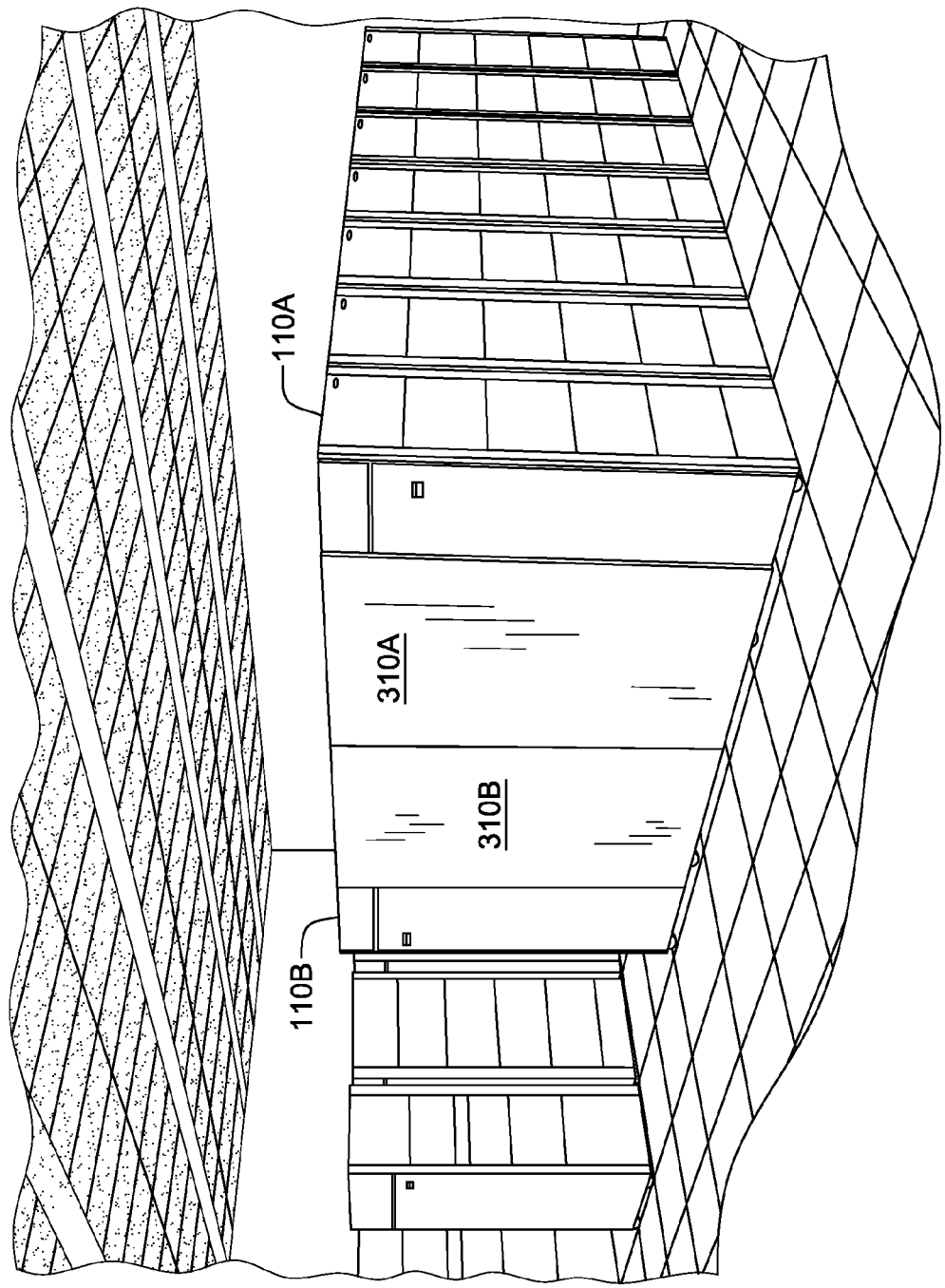
FIG. 4 depicts the data center of FIG. 3, with the acoustically absorptive panels of the acoustically absorptive apparatuses shown extended beyond the front edges of the opposing electronics racks at the ends of the opposing rows, and closing off the aisle of the data center to facilitate attenuation of noise radiating down the aisle from the electronics racks, in accordance with an aspect of the present invention.

To address these issues, provided herein is an acoustical absorption (and anti-recirculation) apparatus which is configured to attenuate noise emanating from the electronics racks within a data center. In one implementation, the acoustical absorption apparatus inhibits noise from escaping the ends of the aisles of a data center such as depicted in FIGS. 3 & 4. Additionally, the acoustically absorptive apparatuses disclosed herein may function as anti-recirculation apparatuses by preventing hot air recirculation from the hot air aisle of the data center to the cold air aisle of the data center around the ends of the rack units in the rows defining the aisles. Advantageously, one or more acoustically absorptive apparatuses disclosed herein may be mounted to the side of a respective electronics rack (see, e.g., FIG. 7E), and subsequently pivoted out from the side of the rack (e.g., until contacting the side of a second, adjoining electronics rack in the row to close off a gap (as depicted in FIG. 7F)) both to attenuate noise emanating from the racks in the vicinity and noise generally present in the data center and to inhibit recirculation of air from the hot aisle to the cold aisle around the sides of the electronics racks on either side of the gap in the row. The acoustically absorptive apparatus includes an acoustically absorptive panel which attenuates noise (and blocks hot air recirculation).

FIG. 3 illustrates one embodiment of two acoustically absorptive apparatuses 300A, 300B mounted to two end electronics racks 110A, 110B in two opposing rows of electronics racks defining, by way of example, a cold air aisle of the data center. In the embodiment illustrated, each acoustically absorptive apparatus 300A, 300B comprises an acoustically absorptive panel 310A 310B sized and configured to substantially correspond in height and width to the height and width of the side of the respective electronics rack 110A, 110B. As explained further below, acoustically absorptive panels 310A, 310B are each mounted via a respective attachment mechanism to the adjoining electronics rack 110A, 110B to be slidable between a retracted position and an extended position. The acoustically absorptive panels are shown in retracted position in FIG. 3, wherein the panels reside along the sides of the respective electronics racks 110A, 110B. In this position, personnel are able to access the cold air or hot air aisle of the data center, however, noise 210 continues to radiate from the end of the aisle.

FIG. 4 depicts the data center of FIG. 3, with acoustically absorptive panels 310A, 310B shown in extended position to close off the end of the aisle defined, in part, between electronics racks 110A, 110B of the opposing rows of electronics racks. In this position, noise is contained at the end of the aisle between the opposing rows of electronics racks. Further, hot air recirculation is blocked from reaching the cold air aisle around the ends of the rows of electronics racks.

As explained further below, the acoustically absorptive panels of the acoustically absorptive apparatuses disclosed herein each comprise multilayer structures with solid wall center septums and acoustically absorptive material layers selected to attenuate noise. FIG. 5 illustrates a further enhancement to the acoustically absorptive apparatuses, wherein the acoustically absorptive panels 510A, 510B mounted via respective attachment mechanisms (not shown) to two opposing electronics racks, include printed and graphical material on at least one side. This printed and graphical material may, in one embodiment, relate to one or more of the electronics racks disposed within the rows of the data center or to the data center itself. In one embodiment, the printed and graphical material may be an advertisement for International Business Machines Corporation, Armonk, N.Y., a manufacturer of electronics racks such as described herein.

FIG. 6 is a side elevational view of two opposing rows of electronics racks 110A, 110B, each row containing at least one electronics rack, and illustrating respective acoustically absorptive apparatuses 600A, 600B mounted thereto and shown with their acoustically absorptive panels 610A, 610B in extended position to closed off the end of the aisle defined between the opposing rows of electronics racks 110A, 110B. In this embodiment, upper frames 611A, 611B and lower frames 612A, 612B are illustrated to at least partially frame the acoustically absorptive panels and thereby facilitate slidable motion thereof relative to the respective attachment mechanism (not shown) mounted to the adjoining electronics racks. To facilitate sliding, one or more support casters 613A, 613B may be provided coupled to lower frames 612A, 612B, respectively. Additionally, one or more handles 614A 614B may be provided along a leading edge of the respective acoustically absorptive panels 610A, 610B, to facilitate manual extension or refraction of the panel relative to the respective electronics rack.

Figure 7B:
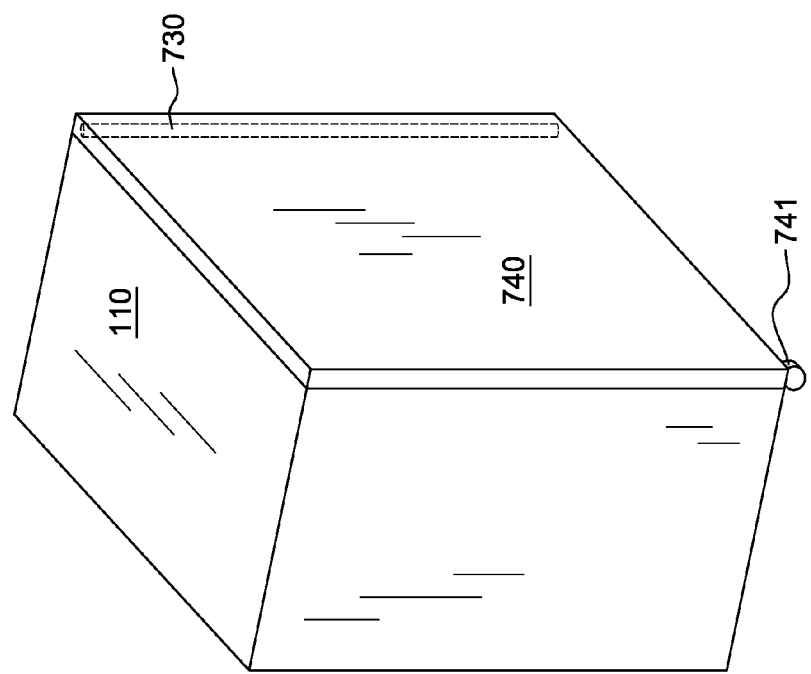
FIG. 7B depicts an acoustically absorptive panel mounted to the side of an electronics rack and depicting a rotatable support pole or hinge of the attachment mechanism of FIG. 7A, in accordance with an aspect of the present invention.
Figure 7A:
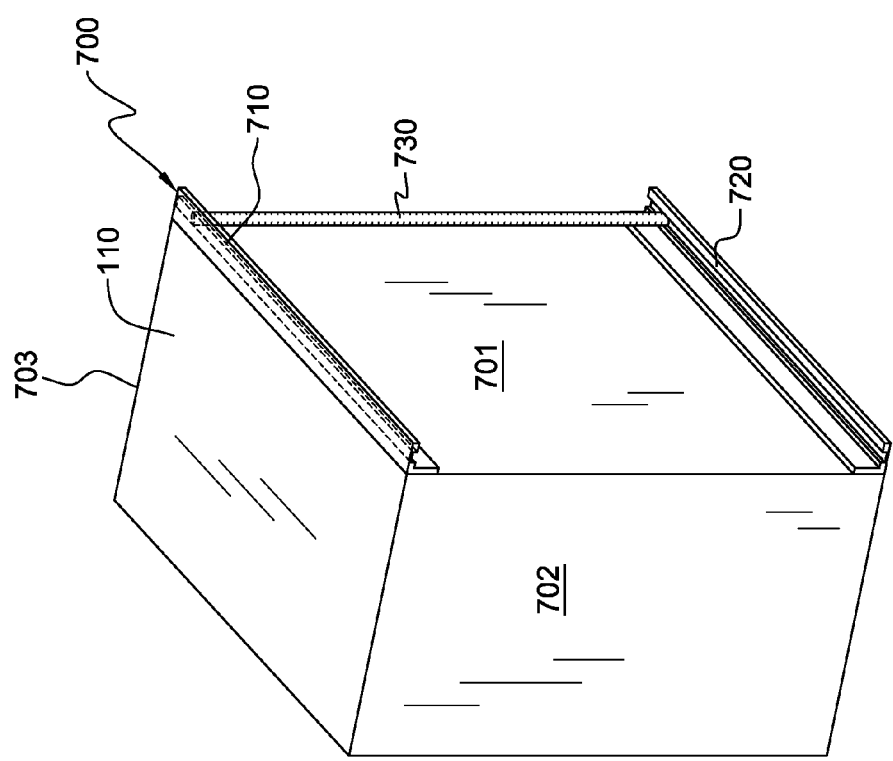
FIG. 7A is a partial depiction of an electronics rack and one embodiment of an attachment mechanism for mounting an acoustically absorptive panel to an electronics rack, in accordance with an aspect of the present invention.

FIG. 7A depicts one embodiment of an electronics rack 110, and one example of an attachment mechanism 700 of an acoustically absorptive apparatus, in accordance with an aspect of the present invention. In this embodiment, attachment mechanism 700 is shown mounted to a side 701 of electronics rack 110 extending between an air inlet side 702 and an air outlet side 703 of electronics rack 110. Attachment mechanism 700 includes an upper U-channel bracket 710, a lower U-channel bracket 720 and a rotatable support pole or hinge mechanism 730 slidably and rotatably vertically extending between upper U-channel bracket 710 and lower U-channel bracket 720. In FIG. 7B, rotatable support pole or hinge mechanism 730 is illustrated passing through or coupled to one end of an acoustically absorptive panel 740 so as to allow for slidable and pivotal movement of the acoustically absorptive panel relative to electronics rack 110. Note that in this embodiment, acoustically absorptive panel 740 has a width and a height substantially equal to the width and height, respectively, of the side of electronics rack 110 to which the acoustically absorptive panel is coupled. Further, shown in this embodiment is a support caster 741 under a leading edge of the acoustically absorptive panel 740. In FIG. 7B, the panel is shown in refracted position.

Figure 7D:
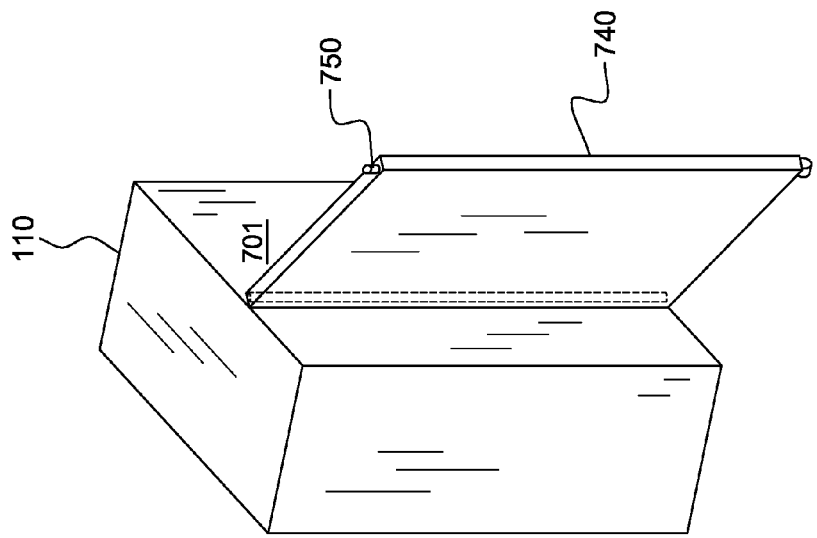
FIG. 7D depicts the acoustically absorptive panel in the extended position of FIG. 7C, shown rotated outward away from the side of the electronics rack, in accordance with an aspect of the present invention.
Figure 7C:
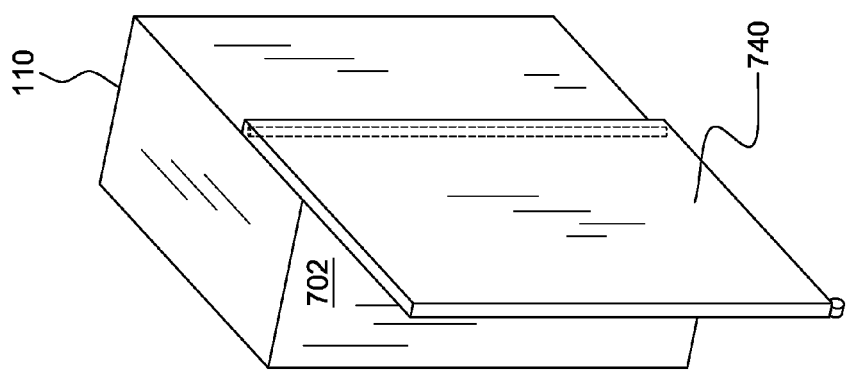
FIG. 7C depicts the acoustically absorptive panel of FIG. 7B, shown in an extended position extending beyond a front or back edge of the electronics rack, in accordance with an aspect of the present invention.

In FIG. 7C, acoustically absorptive panel 740 is shown in at least partially extended position extending beyond the air inlet side 702 of electronics rack 110 to which the acoustically absorptive apparatus is mounted. Note that there may be left-hand mounting versions and right-hand mounting versions of the acoustically absorptive apparatus so that the direction of extension of the acoustically absorptive panel from the rack may be selected as needed for a particular data center implementation. In the extended position, acoustically absorptive panel 740 facilitates attenuating noise emanating from the electronics rack, and further, depending upon the layout of the data center, may facilitate closing off the end of an aisle defined between, for example, a row of electronics racks and a wall of the data center, or between two opposing, spaced rows of electronics racks, with each row comprising at least one electronics rack.

FIG. 7D illustrates that the acoustically absorptive panel is further rotatable away from side 701 of the electronics rack 110. By way of example, one or more spring-biased pins 750 locking within one or both of the upper U-channel bracket or lower U-channel bracket (see FIG. 7A) may be manually released from the respective channel to allow pivoting of the acoustically absorptive panel away from the rack as illustrated. The degree of rotation may be customized and depending on the implementation, may allow for a 90° or a 180° rotational movement. This rotation, when combined with the slidable nature of the acoustically absorptive panel, allows for customization of the positioning of the panel within the data center to, for example, maximize noise attenuation (e.g., where the opposing racks at the end of the aisle are not strictly aligned with each other).

The above-noted characteristics of the acoustically absorptive apparatus presented herein may advantageously be employed, for example, in a data center configuration such as depicted in FIG. 7E. In FIG. 7E, the acoustically absorptive apparatus 700 is mounted to one side of an electronics rack 110C within a row, with the electronics rack being spaced from an adjacent electronics rack 110D in the row by a gap 760 between the respective racks. In FIG. 7F, acoustically absorptive panel 740 is shown rotated away from the side of the electronics rack 110C to which it is mounted to physically contact the side of the adjacent electronics rack 110D. Due to the absorptive nature of both sides of the acoustically absorptive panel, in its rotated position it functions to attenuate noise either emanating directly from the electronics rack in the near vicinity of the panel or to attenuate noise generally reflecting around the data center, and since the acoustically absorptive panel 740 is assumed to have the height of the electronics racks in the row, it functions as a solid wall block to prevent recirculation of air from the hot air aisle to the cold air aisle through gap 760 in the row of electronics racks.

In a further embodiment, the slidable and rotatable nature of the acoustically absorptive panel may advantageously be employed to seal off or facilitate sealing off the end of an aisle where the end electronics racks in the rows defining the aisle are not aligned.

Figure 8B:
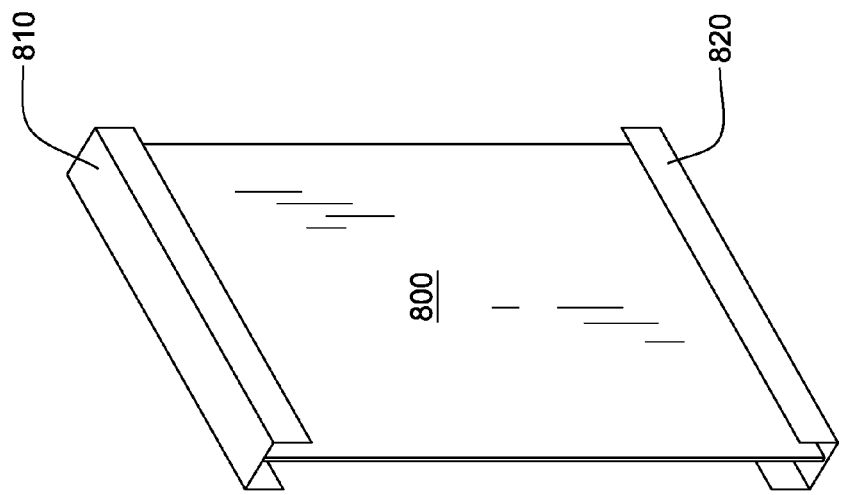
FIG. 8B depicts an alternate embodiment of a portion of an acoustically absorptive panel comprising a multilayer structure, with a solid center septum shown attached to or physically integrated with a portion of a frame of the acoustically absorptive panel, in accordance with an aspect of the present invention.
Figure 8A:
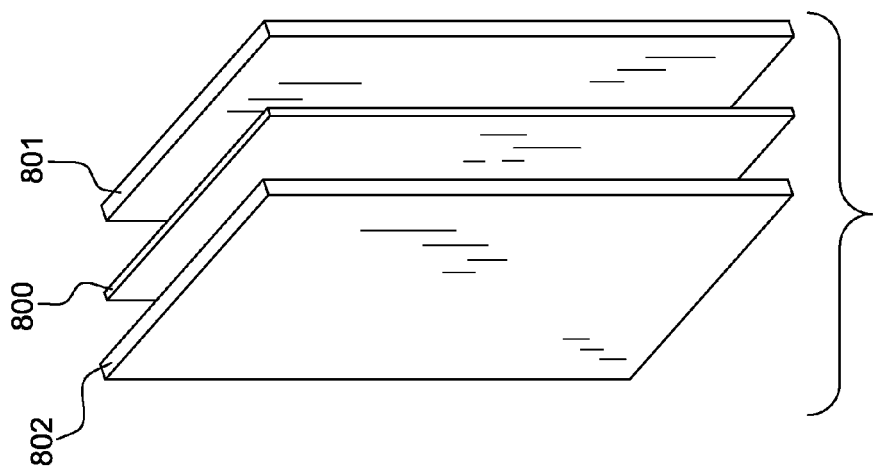
FIG. 8A depicts one embodiment of an acoustically absorptive panel comprising a multilayer structure, in accordance with an aspect of the present invention.

FIG. 8A depicts one embodiment of an acoustically absorptive panel comprising a multilayer structure, wherein a solid center septum 800 is sandwiched between a first acoustically absorptive material layer 801 and a second acoustically absorptive material layer 802. The inclusion of a solid septum effectively serves to block sound transmission through the acoustically absorptive material layers and the overall acoustical panel.

In one embodiment, center septum 800 is a solid wall structure comprising, for example, sheet metal, which is sandwiched between first acoustically absorptive material layer 801 and second acoustically absorptive material layer 802. In addition, the acoustically absorptive material layers may each comprise an acoustically absorptive core material such as fiberglass or polyurethane foam covered by a fabric, such as an acoustically transparent fabric. In one embodiment, the fabric can receive printed material, for example, an advertisement or trademark, as illustrated in FIG. 5.

Figure 8C:
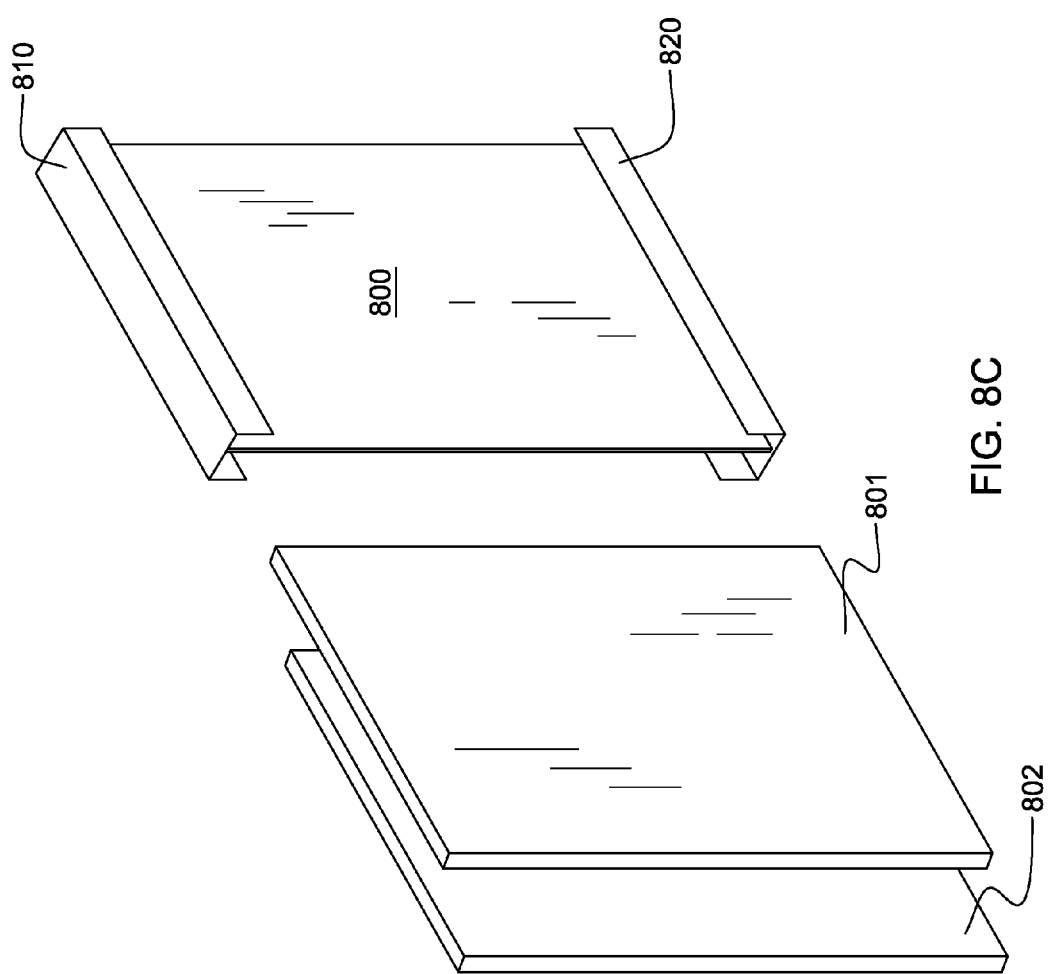
FIG. 8C depicts the acoustically absorptive panel of FIG. 8B, with a first acoustically absorptive material layer and a second acoustically absorptive material layer thereof shown being slid into place on opposite sides of the center septum, in accordance with an aspect of the present invention.

FIG. 8B illustrates a variation on the multilayer structure of FIG. 8A, wherein center septum 800 is shown attached to or integrated with upper frame portion 810 and lower frame portion 820 of a frame of the acoustically absorptive panel. As illustrated, upper and lower frame portions 810, 820 may be configured (in one embodiment) as U-shaped channels, which are sized to allow for the insertion and removal of first acoustically absorptive material layer 801 and second acoustically absorptive material layer 802, as illustrated in FIG. 8C.

In FIG. 8D, first acoustically absorptive material layer 801 is shown residing within the upper and lower channels defined by a first side of center septum 800 and the upper and lower frame portions 810, 820. FIG. 8E is a side elevational view of one embodiment of the finished acoustically absorptive panel 850, wherein a first vertically-oriented frame portion 830 and a second vertically-oriented frame portion 840 of the frame are shown in place to complete the frame. First and second vertically-oriented frame portions 830, 840 could, in one embodiment, snap into place by appropriate configuration of the upper and lower frame portions 810, 820 of the frame.

Referring collectively to FIGS. 9A-9D, a detailed embodiment of an electronics rack frame 900 and an acoustically absorptive apparatus 910, in accordance with an aspect of the present invention, is illustrated. In this embodiment, acoustically absorptive apparatus 910 includes an acoustically absorptive panel 920 configured to reside along one side of electronics rack frame 900. The acoustically absorptive apparatus 910 further includes an attachment mechanism 930 to slidably mount acoustically absorptive panel 920 to electronics rack frame 900.

Figure 9B:
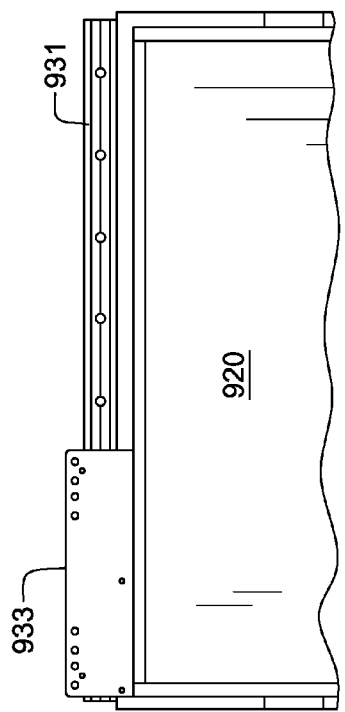
FIG. 9B is a partial side elevational view of the electronics rack frame and acoustically absorptive apparatus of FIG. 9A, in accordance with an aspect of the present invention.
Figure 9A:
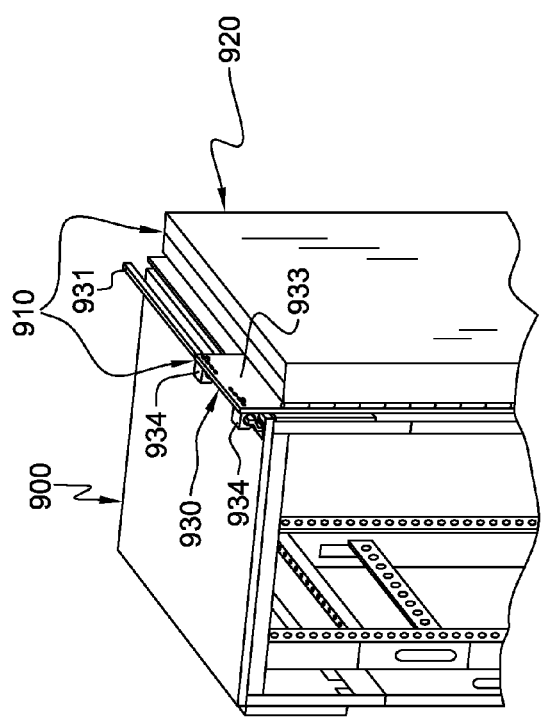
FIG. 9A is a partial depiction of an electronics rack frame and one detailed embodiment of an acoustically absorptive apparatus mounted thereto, with the acoustically absorptive apparatus comprising an acoustically absorptive panel and an attachment mechanism, in accordance with an aspect of the present invention.
Figure 9D:
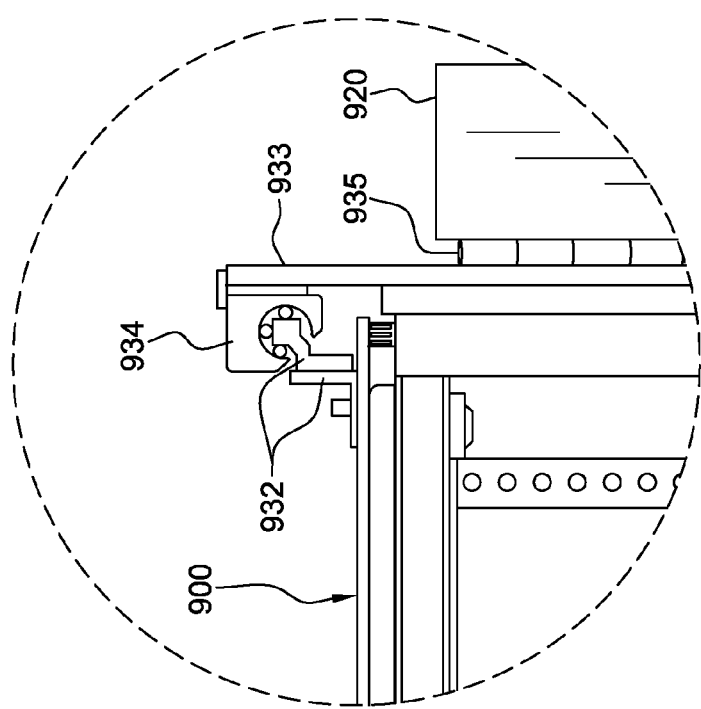
FIG. 9D is a partial enlargement of the electronics rack frame and acoustically absorptive apparatus of FIG. 9C, taken along line 9D, and showing an upper portion of the acoustically absorptive panel and the attachment mechanism, in accordance with an aspect of the present invention.
Figure 9C:
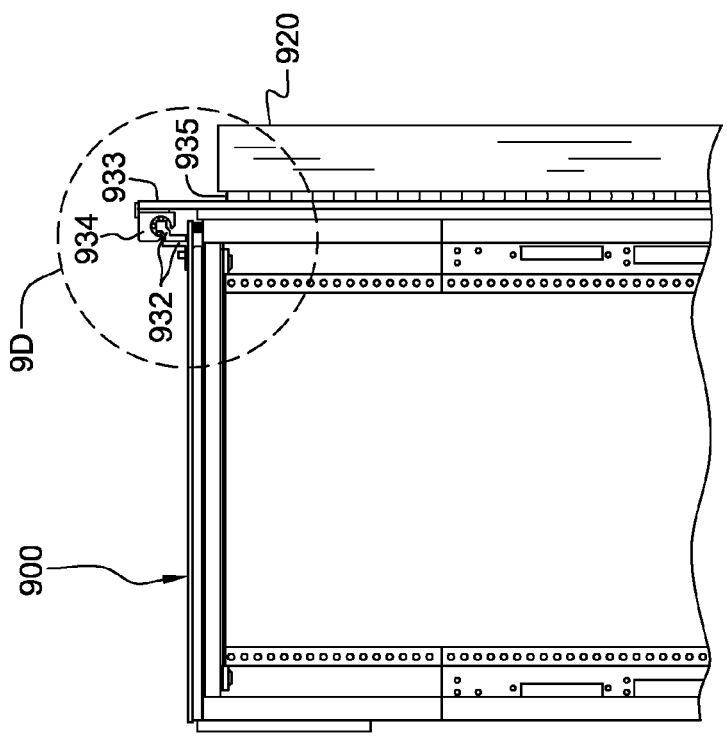
FIG. 9C is a partial front elevational view of the electronics rack frame and acoustically absorptive apparatus of FIGS. 9A & 9B, in accordance with an aspect of the present invention.

In the illustrated embodiment, attachment apparatus 930 comprises one or more rails 931 configured to mount via mounts 932 to electronics rack frame 900, for example, to an upper surface of the frame as illustrated in FIGS. 9C & 9D. Attachment mechanism 930 further includes an attachment plate 933 and at least one slidable guide 934 coupling attachment plate 933 to rail 931. As shown, acoustically absorptive panel 920 is hingedly mounted along a vertical edge thereof to attachment plate 933, for example, via a vertically-oriented "piano-type" hinge 935 that allows rotation of acoustically absorptive panel 920 outward away from electronics rack frame 900. Note that in this example, it is assumed that acoustically absorptive panel 920 is a multilayer structure configured to attenuate noise such as described above in reference to FIGS. 8B-8E.

Those skilled in the art will note from the embodiment of FIGS. 9A-9D, that slidable guides 934 allow for slidable movement of attachment plate 933 relative to electronics rack frame 900, and thus, slidable movement of acoustically absorptive panel 920 coupled to attachment plate 933. In addition, hinges 935 coupling acoustically absorptive panel 920 to attachment plate 933 allow for rotational movement of the acoustically absorptive panel outward away from the side of electronics rack frame 900. As noted, acoustically absorptive apparatus 910 may be configured to extend either in a right hand manner or left hand manner. This can be accomplished by, for example, (hingedly) mounting the acoustically absorptive panel to the attachment plate at either the left side or the right side of the acoustically absorptive panel's frame.

Figure 10A:
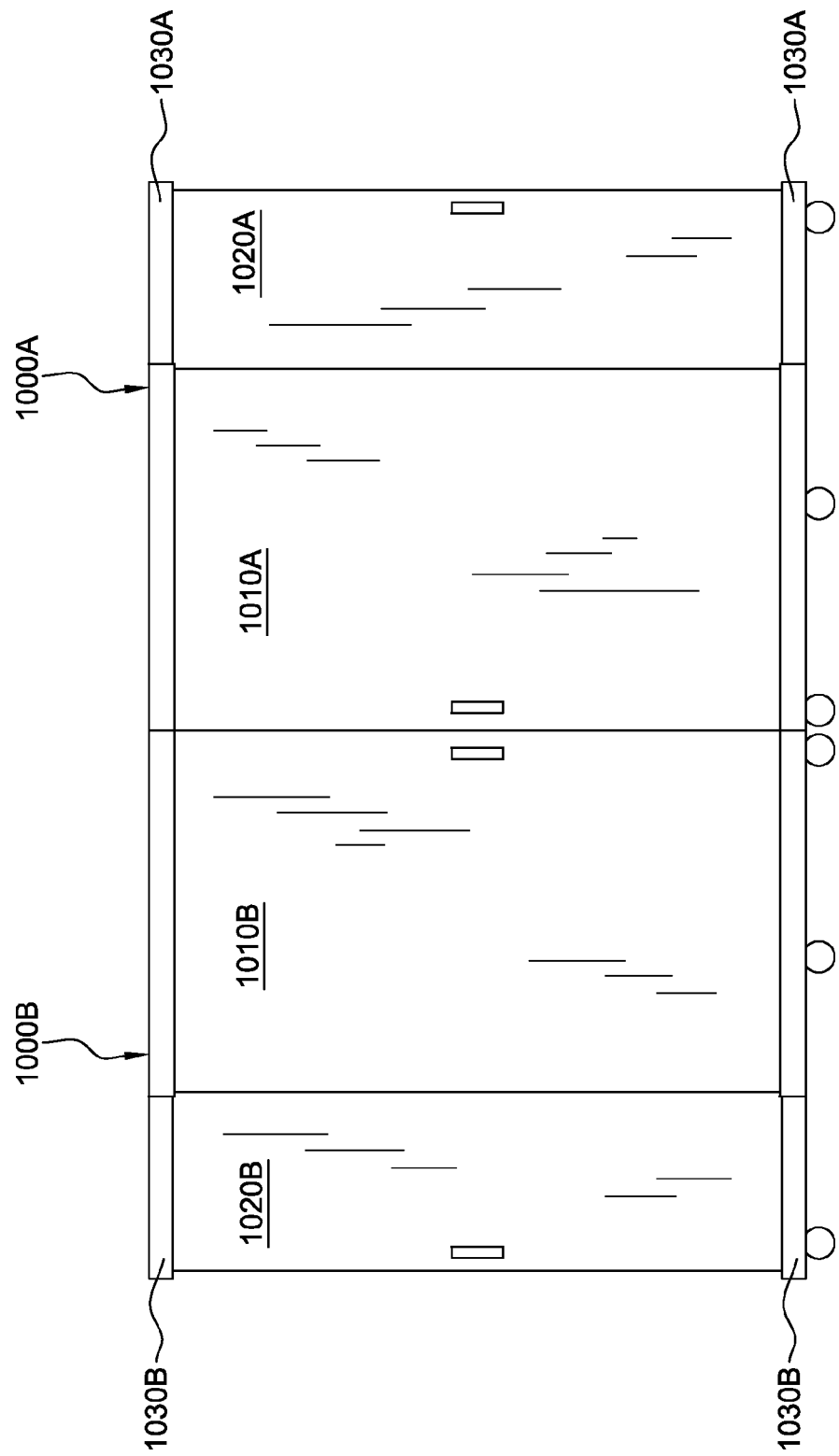
FIG. 10A depicts a side elevational view of two opposing, spaced electronics racks, each with one embodiment of an acoustically absorptive apparatus mounted thereto, with each acoustically absorptive apparatus comprising two acoustically absorptive panels and a dual track attachment mechanism, each shown with one acoustically absorptive panel thereof extended to close off the aisle defined between the two opposing, spaced electronics racks, in accordance with an aspect of the present invention.
Figure 10B:
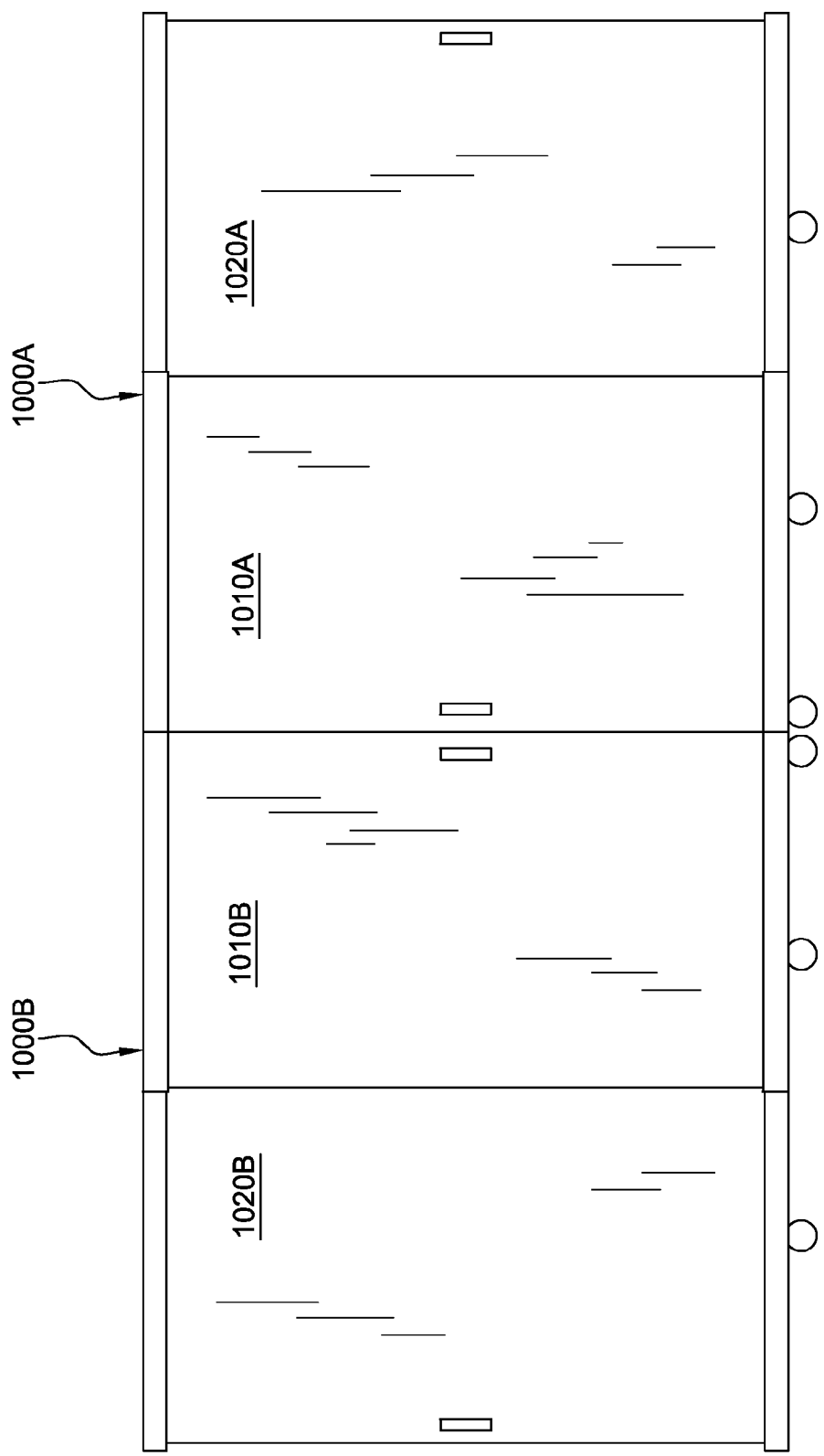
FIG. 10B depicts the electronics racks and acoustically absorptive apparatuses of FIG. 10A, with each acoustically absorptive apparatus shown with its two acoustically absorptive panels in extended position, extending beyond the front and the back edges of the respective electronics rack, in accordance with an aspect of the present invention.

FIGS. 10A & 10B depict an alternative embodiment of two acoustically absorptive apparatuses 1000A, 1000B mounted to the sides of two opposing, spaced electronics racks (not shown) within a data center. In this embodiment, each acoustically absorptive structure 1000A, 1000B comprises a first acoustically absorptive panel 1010A, 1010B and a second acoustically absorptive panel 1020A, 1020B, which are coupled to the respective electronics rack via a dual track attachment mechanism 1030A, 1030B. Each dual track attachment mechanism 1030A, 1030B slidably mounts first acoustically absorptive panel 1010A, 1010B and second acoustically absorptive panel 1020A, 1020B to the side of the respective electronics rack such that in retracted position, the first acoustically absorptive panel and the second acoustically absorptive panel both reside along the side of the electronics rack, while in extended position the first acoustically absorptive panel 1010A, 1010B extends from the electronics rack in a first direction and the second acoustically absorptive panel 1020A, 1020B extends from the electronics rack in a second direction, wherein the first direction and second direction are opposite directions. In FIG. 10A, the first acoustically absorptive panels 1010A, 1010B of the acoustically absorptive apparatuses 1000A, 1000B are shown extended towards each other to physically contact and close off the aisle defined between the opposing, spaced electronics racks to which the apparatuses are mounted. In FIG. 10B, second acoustically absorptive panels 1020A, 1020B are also shown in extended position, for example, to facilitate blocking off ends of adjacent aisles within the data center.

One detailed embodiment of certain structure of FIGS. 10A & 10B is illustrated in FIGS. 11A-11E. Referring collectively to FIGS. 11A-11E, an electronics rack frame 1100 is shown with an acoustically absorptive apparatus 1110 mounted thereto. Acoustically absorptive apparatus 1110 comprises a first acoustically absorptive panel 1111 and a second acoustically absorptive 1112, each of which is slidably mounted to electronics rack frame 1100 via a dual track attachment mechanism 1120. In one embodiment, first acoustically absorptive panel 1111 and second acoustically absorptive panel 1112 are each multilayer structures configured to attenuate noise, and may be, for example, configured as described above in connection with FIGS. 8B-8E.

In the illustrated embodiment of FIGS. 11A-11E, dual track attachment mechanism 1120 comprises a first upper rail 1121 and a second upper rail 1122 which are mounted to, for example, an upper surface of electronics rack frame 1100 directly, in the case of rail 1122 and indirectly via an L-shaped bracket 1123 in the case of rail 1121. A first attachment plate 1125 and a second attachment plate 1126 mount first acoustically absorptive panel 1111 and second acoustically absorptive panel 1112, respectively, to electronics rack frame 1100 such that each acoustically absorptive panel slides between a refracted position in an extended position. This is accomplished, in one embodiment, by coupling first attachment plate 1125 and second attachment plate 1126 via slidable guides 1127 to the respective first upper rail 1121 and second upper rail 1122.

Figure 11A:
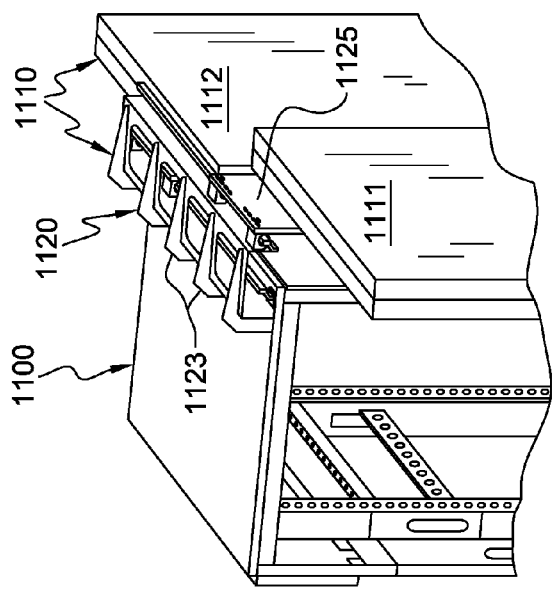
FIG. 11A is a partial depiction of an electronics rack frame and a detailed embodiment of an acoustically absorptive apparatus comprising multiple acoustically absorptive panels and a dual track attachment mechanism, in accordance with an aspect of the present invention.
Figure 11B:
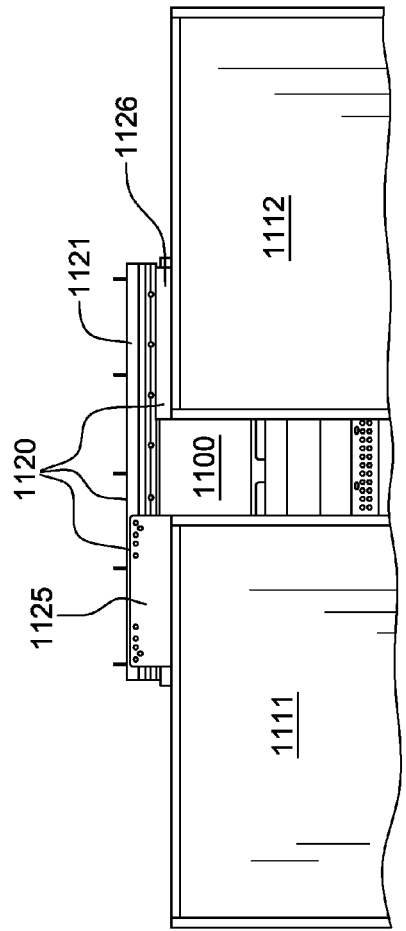
FIG. 11B is a partial side elevational view of the electronics rack frame and acoustically absorptive apparatus of FIG. 11A, shown with the acoustically absorptive panels partially extended, exposing a portion of the electronics rack frame, in accordance with an aspect of the present invention.

In retracted position, both acoustically absorptive panels reside along the side of the electronics rack frame, while in extended position, the first acoustically absorptive panel extends in a first direction and the second acoustically absorptive panel extends in a second direction, which are opposite directions as illustrated in FIGS. 11B & 11C. In their extended positions, the acoustically absorptive panels facilitate attenuating noise emanating from, for example, the air inlet side and the air outlet side of the electronics rack (that is, once assembled and operational). As illustrated, first and second acoustically absorptive panels 1111 and 1112 hingedly couple via a "piano-type" vertical hinge 1128 to the respective first and second attachment plates 1125, 1126. Thus, both the first and second acoustically absorptive panels are slidably extendible, as well as rotatable away from the side of the electronics rack frame to which the acoustically absorptive apparatus is coupled in a manner such as described above.

As shown in FIG. 11E, the bottom of the acoustically absorptive apparatus further includes a lower bracket 1140, which may physically couple a first lower rail and a second lower rail to a lower portion of the electronics rack frame, with the first lower rail and second lower rail facilitating slidable movement of the acoustically absorptive panels 1111 and 1112 via appropriate slidable guides coupling the lower ends of the first and second attachment plates 1125, 1126 to the lower rails in a manner analogous to that described above in connection with the upper rails.

To summarize, provided herein is an acoustically absorptive apparatus which includes an acoustically absorptive panel and an attachment mechanism to slidably mount the acoustically absorptive panel to an electronics rack. The acoustically absorptive panel is configured to be disposed along a side of the electronics rack, and the panel includes a multilayer structure configured to attenuate noise. The attachment mechanism facilitates sliding of the acoustically absorptive panel relative to the electronics rack between a retracted position and an extended position. In the refracted position, the acoustically absorptive panel is disposed along the side of the electronics rack, while in the extended position, the acoustically absorptive panel extends beyond a front edge or a back edge of the electronics rack to facilitate attenuating noise emanating from the electronics rack.

In a further aspect, a data center is provided which includes multiple electronics racks generally abutted together and configured to form rows, wherein a plurality of rows are arranged in parallel forming aisles, and at least one acoustically absorptive apparatus is located at the end of at least one of the aisles. Each electronics rack includes an air inlet side and an air outlet side, with the air inlet and air outlet sides respectively enabling ingress and egress of external air; at least one electronics subsystem requiring cooling; and at least one air moving device, the at least one air moving device being capable of causing external air to flow from the air inlet side of the electronics rack, across the at least one electronics subsystem, to the air outlet side of the electronics rack. Such electronics racks are arrayed customarily in rows with their air inlet sides facing each other and the air outlet sides facing each other to form alternating cold air aisles and hot air aisles, respectively. At least one acoustically absorptive apparatus is coupled to the electronics rack at the end of a row of electronics racks. For example, one acoustically absorptive apparatus might be coupled to the electronics rack at the end of the "left" row of multiple electronics racks, and one coupled to the rack at the end of the "right" row. Each acoustically absorptive apparatus includes: an acoustically absorptive panel configured for disposition along a side of the electronics rack interconnecting the air inlet side and the air outlet side thereof, the acoustically absorptive panel comprising a multilayer structure configured to attenuate noise; and an attachment mechanism slidably mounting the acoustically absorptive panel to the electronics rack, the attachment mechanism facilitating sliding of the acoustically absorptive panel relative to the electronics rack between the refracted position and an extended position, wherein in the refracted position the acoustically absorptive panel is disposed along the side of the electronics rack and in the extended position the acoustically absorptive panel extends beyond one of the air inlet side or air outlet side of the electronics rack to, in one example, mate or abut with a similarly disposed acoustically absorptive panel extending from an acoustically absorptive apparatus coupled to the electronics rack at the end of the adjacent row to essentially close off the aisle between the two rows, and thereby facilitate attenuating noise emanating therefrom.

In another aspect, in a data center containing multiple electronics racks arranged in rows and aisles, a method is presented for facilitating attenuation of noise, while at the same time providing a means of blocking recirculation of air from a hot air aisle to a cold air aisle within the data center (for example) when a "gap" is present in a row of electronics racks. The method includes: providing an acoustically absorptive panel configured to be disposed along a side of one of the two electronics racks on either side of the gap in the row, wherein the acoustically absorptive panel includes a multilayer structure configured to attenuate noise; and mounting the acoustically absorptive panel to the electronics rack, wherein the acoustically absorptive panel is rotatable relative to the electronics rack to which it is mounted between a retracted position and a rotated position, wherein in the retracted position the acoustically absorptive panel is disposed along the side of an electronics rack to which it is mounted and in the rotated position one vertical edge of the acoustically absorptive panel remains in contact with the rack to which it is mounted, and the opposite vertical edge rotates away from that rack at a desired angle to contact the side of the other electronics rack defining the gap in the row of electronics rack.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An acoustically absorptive apparatus comprising:
   an acoustically absorptive panel configured to be disposed along a side of an electronics rack, the acoustically absorptive panel comprising a multilayer structure configured to attenuate noise; and
   an attachment mechanism to slidably mount the acoustically absorptive panel to the electronics rack, the attachment mechanism facilitating sliding of the acoustically absorptive panel relative to the electronics rack between a retracted position and an extended position, wherein in the retracted position the acoustically absorptive panel is disposed along the side of the electronics rack and in the extended position the acoustically absorptive panel extends beyond a front edge or a back edge of the electronics rack to facilitate attenuating noise emanating therefrom.

2. The acoustically absorptive apparatus of claim 1, wherein the acoustically absorptive panel hingedly couples along a vertical edge thereof to the attachment mechanism such that the acoustically absorptive panel is also rotatable outward away from the side of the electronics rack to facilitate positioning of the acoustically absorptive panel to enhance noise attenuation.

3. The acoustically absorptive apparatus of claim 2, wherein slidable mounting of the acoustically absorptive panel to the electronics rack and hinged coupling of the acoustically absorptive panel to the attachment mechanism further allow extension and rotation, respectively, of the acoustically absorptive panel to inhibit recirculation of air around the side of the electronics rack, and thereby enhance air cooling of the electronics rack.

4. The acoustically absorptive apparatus of claim 2, wherein the attachment mechanism comprises at least one rail configured to mount to the electronics rack, an attachment plate, and at least one slidable guide slidably coupling the attachment plate to the at least one rail, and wherein the acoustically absorptive panel is hingedly mounted to the attachment plate along a vertical edge thereof such that the acoustically absorptive panel is slidable between the retracted and extended positions, and is rotatable outward away from the attachment plate in the retracted position, the extended position, or any position therebetween.

5. The acoustically absorptive apparatus of claim 4, wherein the acoustically absorptive panel has a height and a width substantially equal to a height and a width, respectively, of the side of the electronics rack.

6. The acoustically absorptive apparatus of claim 1, wherein the multilayer structure of the acoustically absorptive panel comprises a solid wall septum disposed between a first acoustically absorptive material layer and a second acoustically absorptive material layer.

7. The acoustically absorptive apparatus of claim 6, wherein the solid wall septum is integrated with at least a portion of a frame of the acoustically absorptive panel.

8. The acoustically absorptive apparatus of claim 7, wherein the frame further comprises a first set of upper and lower channels at a first side of the solid wall septum and a second set of upper and lower channels at a second side of the solid wall septum for receiving the first acoustically absorptive material layer and the second acoustically absorptive material layer, respectively, wherein the first acoustically absorptive material layer and the second acoustically absorptive material layer slide into the first set of upper and lower channels and the second set of upper and lower channels, respectively.

9. The acoustically absorptive apparatus of claim 6, wherein at least one of the first acoustically absorptive material layer or the second acoustically absorptive material layer includes printed or graphical material on at least one side thereof, the printed or graphical material relating to at least one of the electronics rack or a data center containing the electronics rack.

10. The acoustically absorptive apparatus of claim 1, wherein the acoustically absorptive panel is a first acoustically absorptive panel, and wherein the acoustically absorptive apparatus further comprises a second acoustically absorptive panel, and wherein the attachment mechanism is a dual track attachment mechanism which slidably couples the first acoustically absorptive panel and the second acoustically absorptive panel to the side of the electronics rack such that in the retracted position the first acoustically absorptive panel and the second acoustically absorptive panel are disposed along the side of the electronics rack, and in the extended position the first acoustically absorptive panel extends from the electronics rack in a first direction and the second acoustically absorptive panel extends from the electronics rack in a second direction, wherein the first direction and the second direction are opposite directions.

11. The acoustically absorptive apparatus of claim 10, wherein the first acoustically absorptive panel hingedly couples to the dual track attachment mechanism along a vertical edge thereof and the second acoustically absorptive panel hingedly couples to the dual track attachment mechanism along a vertical edge thereof, wherein both the first acoustically absorptive panel and the second acoustically absorptive panel are rotatable outward away from the side of the electronics rack to facilitate noise attenuation.

12. A data center comprising:
multiple electronics racks, each electronics rack comprising:
an air inlet side and an air outlet side, the air inlet side and the air outlet side respectively enabling ingress and egress of external air;
at least one electronics subsystem requiring cooling;
at least one air moving device, the at least one air moving device being capable of causing external air to flow from the air inlet side of the electronics rack, across the at least one electronics subsystem, to the air outlet side of the electronics rack; and
at least one acoustically absorptive apparatus, each acoustically absorptive apparatus being coupled to a respective electronics rack of the multiple electronics racks, and comprising:
an acoustically absorptive panel configured to reside along a side of the electronics rack interconnecting the air inlet side and the air outlet side thereof, the acoustically absorptive panel comprising a multilayer structure configured to attenuate noise; and
an attachment mechanism slidably mounting the acoustically absorptive panel to the electronics rack, the attachment mechanism facilitating sliding of the acoustically absorptive panel relative to the electronics rack between a retracted position and an extended position, wherein in the retracted position the acoustically absorptive panel is disposed along the side of the electronics rack and in the extended position the acoustically absorptive panel extends beyond one of the air inlet side or the air outlet side of the electronics rack to facilitate attenuating noise emanating therefrom.

13. The data center of claim 12, wherein the multiple electronics racks comprise at least two electronics racks in spaced, opposing relation and defining an aisle therebetween, and wherein the acoustically absorptive panel in the extended position at least partially blocks the aisle, and thereby facilitates attenuating noise emanating into the aisle from the at least two electronics racks in spaced, opposing relation.

14. The data center of claim 13, further comprising at least two acoustically absorptive apparatuses, each acoustically absorptive apparatus being coupled to a respective electronics rack of the at least two electronics racks in spaced, opposing relation defining the aisle therebetween, and wherein the acoustically absorptive panel of each acoustically absorptive apparatus facilitates in the extended position closing off the aisle defined between the at least two electronics racks, thereby facilitating attenuation of noise emanating from the electronics racks.

15. The data center of claim 12, wherein the acoustically absorptive panel hingedly couples along a vertical edge thereof to the attachment mechanism such that the acoustically absorptive panel is also rotatable outward away from the side of the electronics rack to facilitate positioning of the acoustically absorptive panel to enhance noise attenuation.

16. The data center of claim 12, wherein the multilayer structure of the acoustically absorptive panel comprises a solid wall septum disposed between a first acoustically absorptive material layer and a second acoustically absorptive material layer, and wherein the solid wall septum is integrated with at least a portion of a frame of the acoustically absorptive panel, the frame comprising a first set of upper and lower channels at a first side of the solid wall septum and a second set of upper and lower channels at a second side of the solid wall septum for receiving the first acoustically absorptive material layer and the second acoustically absorptive material layer, respectively.

17. The data center of claim 12, wherein the acoustically absorptive panel is a first acoustically absorptive panel, and wherein the acoustically absorptive apparatus further comprises a second acoustically absorptive panel, and wherein the attachment mechanism is a dual track attachment mechanism which slidably couples the first acoustically absorptive panel and the second acoustically absorptive panel to the side of the electronics rack such that in the retracted position, the first acoustically absorptive panel and the second acoustically absorptive panel reside along the side of the electronics rack, and in the extended position the first acoustically absorptive panel extends from the electronics rack in a first direction and the second acoustically absorptive panel extends from the electronics rack in a second direction, wherein the first direction and the second direction are opposite directions.

18. The data center of claim 17, wherein the first acoustically absorptive panel hingedly couples to the dual track attachment mechanism along a vertical edge thereof and the second acoustically absorptive panel hingedly couples to the dual track attachment mechanism along a vertical edge thereof, wherein both the first acoustically absorptive panel and the second acoustically absorptive panel are rotatable outward away from the side of the electronics rack to facilitate positioning thereof to enhance noise attenuation.

19. A method of facilitating attenuation of noise emanating from an electronics rack, the method comprising:
   providing an acoustically absorptive panel configured to be disposed along a side of the electronics rack, the acoustically absorptive panel comprising a multilayer structure to attenuate noise; and
   slidably mounting the acoustically absorptive panel to the electronics rack, wherein the acoustically absorptive panel is slidable relative to the electronics rack between a retracted position and an extended position, wherein in the retracted position the acoustically absorptive panel is disposed along the side of the electronics rack and in the extended position the acoustically absorptive panel extends beyond a front edge or a back edge of the electronics rack to facilitate attenuating noise emanating therefrom.

20. The method of claim 19, further comprising hingedly mounting the acoustically absorptive panel along a vertical edge thereof to the attachment mechanism such that the acoustically absorptive panel is rotatable outward away from the side of the electronics rack in the retracted position, the extended position or any position therebetween to facilitate positioning of the acoustically absorptive panel to enhance noise attenuation.

* * * * *